(12) United States Patent
Do et al.

(10) Patent No.: US 12,453,184 B2
(45) Date of Patent: Oct. 21, 2025

(54) INTEGRATED CIRCUIT INCLUDING STANDARD CELLS AND METHOD OF DESIGNING THE SAME

(71) Applicant: Samsung Electronics Co., Ltd., Suwon-si (KR)

(72) Inventors: Jungho Do, Suwon-si (KR); Taejoong Song, Suwon-si (KR); Sanghoon Baek, Suwon-si (KR); Jisu Yu, Suwon-si (KR); Hyeongyu You, Suwon-si (KR); Minjae Jeong, Suwon-si (KR); Jonghoon Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 403 days.

(21) Appl. No.: 18/185,414

(22) Filed: Mar. 17, 2023

(65) Prior Publication Data

US 2023/0307436 A1    Sep. 28, 2023

(30) Foreign Application Priority Data

Mar. 25, 2022 (KR) .......................... 10-2022-0037504
Jun. 3, 2022 (KR) .......................... 10-2022-0068508

(51) Int. Cl.

| H01L 27/02 | (2006.01) |
|---|---|
| H01L 27/088 | (2006.01) |
| H01L 29/06 | (2006.01) |
| H01L 29/423 | (2006.01) |
| H01L 29/775 | (2006.01) |
| H01L 29/78 | (2006.01) |

(Continued)

(52) U.S. Cl.
CPC ............. *H10D 89/10* (2025.01); *H10D 30/43* (2025.01); *H10D 30/6211* (2025.01); *H10D 30/6735* (2025.01); *H10D 30/6757* (2025.01); *H10D 62/121* (2025.01); *H10D 84/834* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 30/6757; H10D 62/118; H10D 62/119; H10D 62/121; H10D 84/0158; H10D 84/0193; H10D 84/834; H10D 84/853; H10D 84/907; H10D 84/975; H10D 89/10

See application file for complete search history.

(56) References Cited

U.S. PATENT DOCUMENTS 9,536,032 B2 *  1/2017  Chiang ................... G06F 30/39
10,162,930 B2 * 12/2018  Lin ....................... G06F 30/367

(Continued)

*Primary Examiner* — David C Spalla
(74) *Attorney, Agent, or Firm* — Wolf, Greenfield & Sacks, P.C.

(57) ABSTRACT

An integrated circuit may include a first function cell and a second function cell each corresponding to a first circuit, wherein the first function cell may include a first pattern extending in a first direction along a first grid in a first layer and a second pattern extending in the first direction along a second grid in a second layer, the first grid may have a first pitch greater than a second pitch of the second grid in a second direction crossing the first direction, and the second function cell may include a layout of the first function cell and have a length greater than a length of the first function cell by the first pitch in the second direction.

20 Claims, 42 Drawing Sheets

(51) Int. Cl.

| | |
|---|---|
| *H01L 29/786* | (2006.01) |
| *H10D 30/43* | (2025.01) |
| *H10D 30/62* | (2025.01) |
| *H10D 30/67* | (2025.01) |
| *H10D 62/10* | (2025.01) |
| *H10D 84/83* | (2025.01) |
| *H10D 89/10* | (2025.01) |

(56) References Cited

U.S. PATENT DOCUMENTS

| | | |
|---|---|---|
| 10,593,701 B2 | 3/2020 | Seo et al. |
| 10,622,306 B2 | 4/2020 | Liaw |
| 10,622,999 B2 | 4/2020 | Song et al. |
| 10,748,889 B2 | 8/2020 | Berzins et al. |
| 11,170,152 B2 | 11/2021 | Chen et al. |
| 2020/0357823 A1* | 11/2020 | Kumar ................ H10D 84/853 |
| 2021/0305232 A1 | 9/2021 | You et al. |
| 2021/0375863 A1* | 12/2021 | Komuro ................ H10D 88/00 |

\* cited by examiner

INTEGRATED CIRCUIT INCLUDING STANDARD CELLS AND METHOD OF DESIGNING THE SAME

CROSS-REFERENCE TO RELATED APPLICATIONS

This application is based on and claims priority under 35 U.S.C. § 119 to Korean Patent Application No. 10-2022-0037504, filed on Mar. 25, 2022, and Korean Patent Application No. 10-2022-0068508, filed on Jun. 3, 2022, in the Korean Intellectual Property Office, the disclosures of which are incorporated by reference herein in their entireties.

BACKGROUND

The inventive concept relates to an integrated circuit, and more particularly, to an integrated circuit including standard cells and a method of designing the integrated circuit.

Due to the development of a semiconductor process, sizes of devices may be reduced, and devices included in an integrated circuit may increase. An integrated circuit may include standard cells, each of which may be designed to perform a specific function. Various requirements may be imposed by fabrication processes. Standard cells may be arranged to comply with those various requirements, and thus the efficiency of an integrated circuit may be reduced.

SUMMARY

The inventive concept provides an integrated circuit including efficiently arranged standard cells and a method of designing the integrated circuit.

According to an aspect of the inventive concept, an integrated circuit includes a first function cell including at least one first pattern extending in a first direction along a first grid in a first layer and at least one second pattern extending in the first direction along a second grid in a second layer, and a second function cell including at least one third pattern extending in the first direction along the first grid in the first layer, and at least one fourth pattern extending in the first direction along the second grid in the second layer, wherein the first function cell and the second function cell respectively correspond to a first circuit, the first grid has a first pitch greater than a second pitch of the second grid in a second direction crossing the first direction, the second grid has a first offset from the first grid in the first function cell and has a second offset different from the first offset from the first grid in the second function cell, and in the first function cell and the second function cell, a pattern, which overlaps a line of the second grid having a third offset from the first grid and extends in the first direction in the second layer, is omitted. In some embodiments, the at least one second pattern does not overlap the grid line of the second grid in the first function cell, and the at least one fourth pattern does not overlap the grid line of the second grid in the second function cell.

According to another aspect of the inventive concept, an integrated circuit includes a first function cell and a second function cell each corresponding to a first circuit, wherein the first function cell includes a first pattern extending in a first direction along a first grid in a first layer, and a second pattern extending in the first direction along a second grid in a second layer, the first grid has a first pitch greater than a second pitch of the second grid in a second direction crossing the first direction, and the second function cell includes a layout of the first function cell and has a length (e.g., a length in the second direction) greater than a length of the first function cell (e.g., a length in the second direction) by the first pitch.

According to another aspect of the inventive concept, an integrated circuit includes a first function cell, a second function cell, a third function cell, and a fourth function cell each corresponding to a first circuit, wherein each of the first function cell, the second function cell, the third function cell, and the fourth function cell includes a first pattern extending in a first direction along a first grid in a first layer and a second pattern extending in the first direction along a second grid in a second layer, the first grid has a first pitch greater than a second pitch of the second grid in a second direction crossing the first direction, the second grid has a first offset from the first grid in the first function cell and the third function cell and has a second offset from the first grid in the second function cell and the fourth function cell, the second pattern of the first function cell and the second pattern of the second function cell are first exposure patterns of multi-patterning, and the second pattern of the third function cell and the second pattern of the fourth function cell are second exposure patterns of multi-patterning.

According to another aspect of the inventive concept, an integrated circuit includes a first function cell arranged in a first row extending in a first direction, and a second function cell arranged in a second row extending in the first direction and adjacent to the first row, wherein each of the first function cell and the second function cell corresponds to a first circuit, includes at least one pattern and extending in the first direction at a first pitch in a first layer, the at least one pattern of the first function cell includes a first pattern closer than the first pitch from a first boundary between the first row and the second row, the first pattern is included in a first exposure pattern group of multi-patterning, and the second pattern is included in a second exposure pattern group of the multi-patterning.

According to another aspect of the inventive concept, an integrated circuit includes a first function cell and a second function cell each arranged in a first row extending in a first direction and each corresponding to a first circuit, wherein each of the first function cell and the second function cell includes a plurality of patterns extending in a second direction perpendicular to the first direction at a first pitch in a first layer, the plurality of patterns of the first function cell include a first pattern and a second pattern respectively corresponding to a first node and a second node of the first circuit, the plurality of patterns of the second function cell include a third pattern and a fourth pattern respectively corresponding to the first node and the second node, the first pattern and the fourth pattern are included in a first exposure pattern group of multi-patterning, and the second pattern and the third pattern are included in a second exposure pattern group of the multi-patterning.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
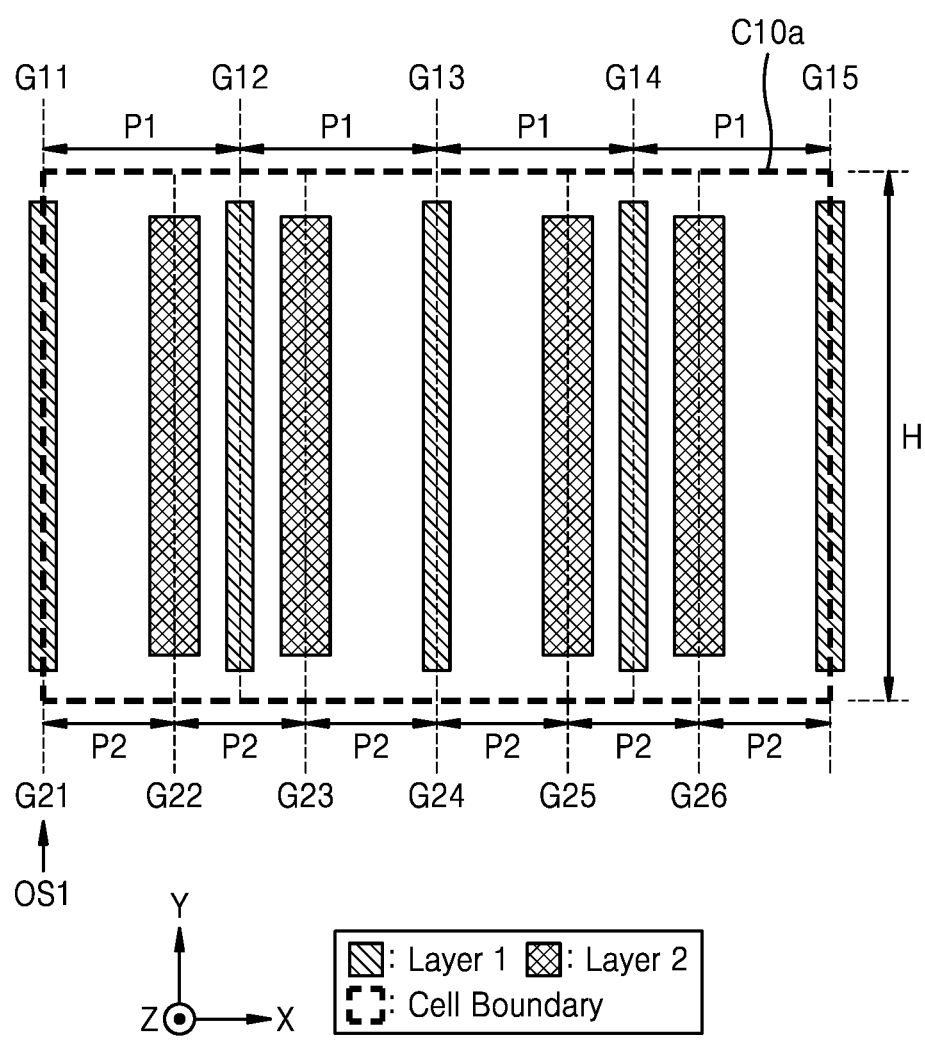
FIGS. 1A and 1B are plan views illustrating layouts of standard cells according to example embodiments.
Figure 1B:
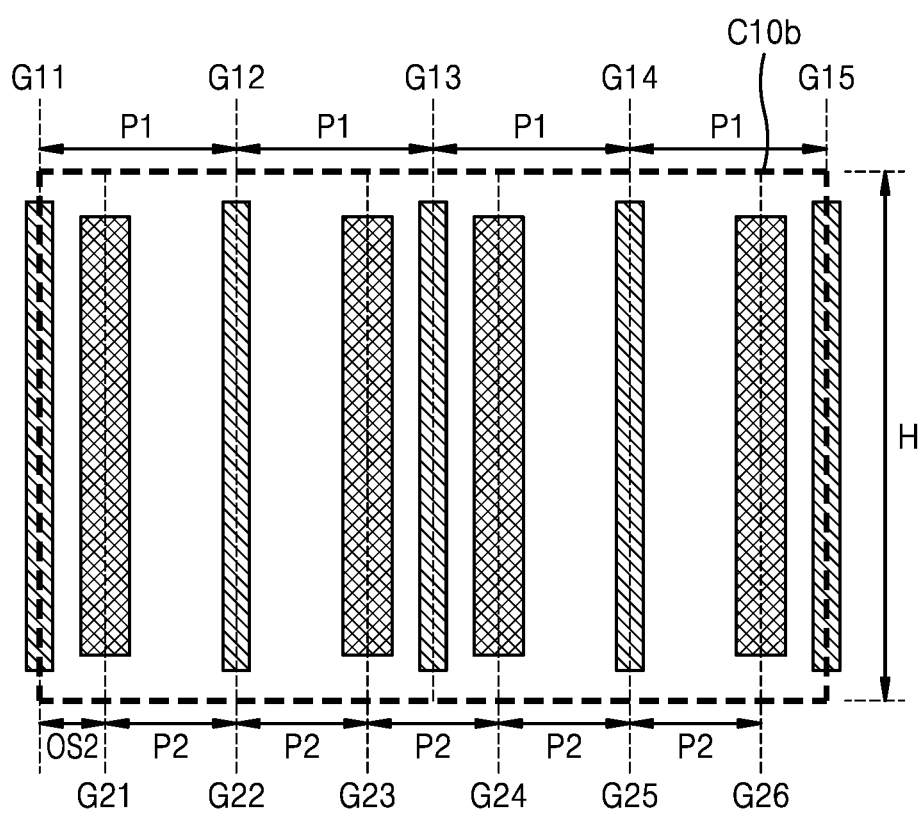

FIGS. 1A and 1B are plan views illustrating layouts of standard cells C10a and C10b according to example embodiments. Specifically, the plan views of FIGS. 1A and 1B illustrate patterns of a first layer and patterns of a second layer, which are included in the standard cells C10a and C10b. The patterns illustrated in the drawings herein may correspond to patterns that may be included in standard cells, and it is noted that the standard cells may include some of the patterns of the first and second layers illustrated in the drawings and/or patterns shortened from the patterns of the first and second layers illustrated in the drawings. As used herein, "patterns of a layer" may refer to "components of the layer." Further, in some embodiments, the layer may only consist of those patterns.

Herein, a Y-axis direction and an X-axis direction may be referred to respectively as a first direction (also referred to as a first horizontal direction) and a second direction (also referred to as a second horizontal direction), and a Z-axis direction may be referred to as a third direction or a vertical direction. A plane made up of the X and Y axes may be referred to as a horizontal plane, and a component arranged in a +Z direction relatively to another component may be referred to as being above another component, and a component arranged in a −Z direction relatively to another component may be referred to as being below another component. In addition, an area of a component may refer to a size occupied by the component in a plane parallel to the horizontal plane, and a width of a component may refer to a length in a direction orthogonal to a direction in which the component extends. In addition, when components are coupled or electrically connected to each other, the components may be referred to as being connected to each other. In the drawings herein, only some layers may be illustrated for the sake of convenience of illustration. In addition, a pattern formed of a conductive material, such as a pattern of a routing layer, may also be referred to as a conductive pattern or simply a pattern.

An integrated circuit may include a plurality of standard cells. A standard cell is a unit of a layout included in an integrated circuit and may be designed to perform a predefined function or may also be referred to simply as a cell. A standard cell may include a function cell designed to generate an output signal from an input signal and a filler cell inserted in a space between function cells. An integrated circuit may include many different standard cells, and the standard cells may be arranged in a plurality of rows. For example, as illustrated in FIGS. 1A and 1B, the standard cells C10a and C10b may each have a length H in the Y-axis direction and may be arranged in rows extending in the X-axis direction with a width H. A standard cell arranged in one row, such as the standard cells C10a and C10b in FIGS. 1A and 1B, may be referred to as a single height cell, and cells arranged consecutively in two or more rows, such as the standard cell C40b in FIG. 4B, may be referred to as multiple height cells.

Patterns may extend parallel to rows at boundaries between the rows to supply power to standard cells, and the patterns may be referred to as power rails. For example, patterns, to which a positive supply voltage VDD and a negative supply voltage VSS are applied, may extend in the X-axis direction on the boundaries of the standard cells C10a and C10b parallel in the X axis. In some embodiments, in one row, an active region (or a device region), in which a P-type transistor is formed, and an active region (or a device region), in which an N-type transistor is formed, may extend parallel to each other in the X-axis direction. In addition, at least one active pattern may extend in the X-axis direction in the active region, and the active pattern may cross a gate electrode extending in the Y-axis direction to form a transistor. As described below with reference to FIGS. 14A to 14C, the standard cells C10a and C10b may include devices having various structures.

The standard cells C10a and C10b may each include patterns of a first layer and patterns of a second layer. herein, the first layer may be under the second layer, and the first layer and the second layer may be any conductive layers included in an integrated circuit. For example, each of the first layer and the second layer may be one of a gate electrode layer, a contact layer, and wiring layers (or routing layers). In addition, each of the first layer and the second layer may be one of a plurality of contact layers, as described below with reference to FIGS. 13A to 13F. The routing layers may include patterns extending over the contact layer, and the patterns may include metal. In some embodiments, the first layer or the second layer may be an upper layer of the gate electrode. In some embodiments, the first layer or the second layer may be an upper layer of a gate contact. In some embodiments, the first layer or the second layer may be an upper layer of a diffusion contact.

The patterns of the first layer may be arranged according to a first grid, and the patterns of the second layer may be arranged according to a second grid. For example, as illustrated in FIGS. 1A and 1B, the first grid may include first grid lines G11 to G15 extending in the Y-axis direction at a first pitch P1, and the patterns of the first layer may extend in the Y-axis direction on the first grid lines G11 to G15. In addition, the second grid may include second grid lines G21 to G26 extending in the Y-axis direction at a second pitch P2, and the patterns of the second layer may extend in the Y-axis direction on the second grid lines G21 to G26. In some embodiments, the patterns of the first layer extending on the boundaries of the standard cells C10a and C10b may be omitted. When the first layer is a gate electrode layer and the patterns of the first layer are gate electrodes, the first pitch P1 may be referred to as a contacted poly pitch (CPP).

As illustrated in FIGS. 1A and 1B, the first pitch P1 of the first grid may be greater than the second pitch P2 of the second grid (P1>P2), and thus, a grid mismatch may occur. A ratio between the first pitch P1 and the second pitch P2 in FIGS. 1A and 1B may be 3:2, and thus, an offset between the first grid and the second grid in the standard cell C10a of FIG. 1A may be different from an offset between the first grid and the second grid in the standard cell C10b of FIG. 1B. Herein, the offset of the grid may refer to an offset of the second grid line of the second grid with respect to the first grid line of the first grid in the leftmost direction, that is, the −X direction in the standard cell. For example, in FIG. 1A, a first grid offset OS1 of the standard cell C10a may be zero because the first grid line G11 overlaps the second grid line G21. In addition, in FIG. 1B, a second grid offset OS2 of the standard cell C10b may correspond to a distance between the first grid line G11 and the second grid line G21 and may have a positive value (OS2=P1/3=P2/2). Herein, the grid offsets may be referred to simply as offsets.

An integrated circuit may include standard cells that correspond to the same circuit and respectively have different grid offsets. For example, the standard cells C10a and C10b of FIGS. 1A and 1B may correspond to the same circuit and may have different grid offsets (that is, OS1 and OS2). When a ratio between the first pitch P1 of the first grid and the second pitch P2 of the second grid is m:n (m and n are positive integers, m>n), an integrated circuit may include n standard cells, each having n different offsets. For example, as in the examples of FIGS. 1A and 1B, when the ratio between the first pitch P1 and the second pitch P2 is 3:2, an integrated circuit may include standard cells, each having two different grid offsets (that is, OS1 and OS2). In addition, when the ratio between the first pitch P1 and the second pitch P2 is 4:3, an integrated circuit may include standard cells, each having three different grid offsets. Herein, examples in which the ratio between the first pitch P1 and the second pitch P2 is 3:2 will be mainly described, but it will be understood that example embodiments are not limited thereto. As used herein, "standard cells corresponding to the same circuit" (or similar language) may mean that the standard cells provide the same function. For example, two standard cells corresponding to the same circuit provide the same storage function (e.g., flipflop or latch) or the same Boolean logic function (e.g., AND, XNOR or inverter).

In some embodiments, the patterns of the second layer extending on second grid lines having a predefined offset from adjacent first grid lines may be omitted in the standard cells. For example, as illustrated in FIGS. 1A and 1B, the patterns of the second layer extending in the Y-axis direction on the second grid lines (that is, G24 in FIG. 1A and G22 and G25 in FIG. 1B) overlapping an adjacent first grid line (that is, having an offset which is zero) may be omitted. As described below with reference to FIG. 2, the patterns of the second layer crossing the standard cell may be arranged on the second grid lines in which the patterns of the second layer are omitted in the standard cell. In some embodiments, the patterns of the second layer crossing the standard cell may be connected to power rails, and the positive supply voltage VDD and the negative supply voltage VSS may be applied thereto. That is, for patterns crossing the standard cells, the standard cells C10a and C10b may not include the patterns of the second layer extending on the second grid line overlapping the first grid line.

As described below with reference to FIG. 16, the standard cells C10a and C10b of FIGS. 1A and 1B corresponding to the same circuit may be prepared, and a suitable standard cell among the standard cells C10a and C10b may be selected and arranged in the process of designing an integrated circuit. For example, when a standard cell having zero grid offset (that is, OS1) is possible to be arranged adjacent to a previously arranged standard cell, the standard cell C10a of FIG. 1A may be selected, and when a standard cell having a grid offset (that is, OS2) of P2/2 is possible to be arranged adjacent to the previously arranged standard cell, the standard cell C10b of FIG. 1B may be selected. Accordingly, an area wasted due to grid mismatch may be removed, and the efficiency of an integrated circuit may be increased. In addition, due to efficiently arranged standard cells, delays occurring in routing congestion and interconnection may be reduced, and thus, the performance of an integrated circuit may be improved.

Figure 2:
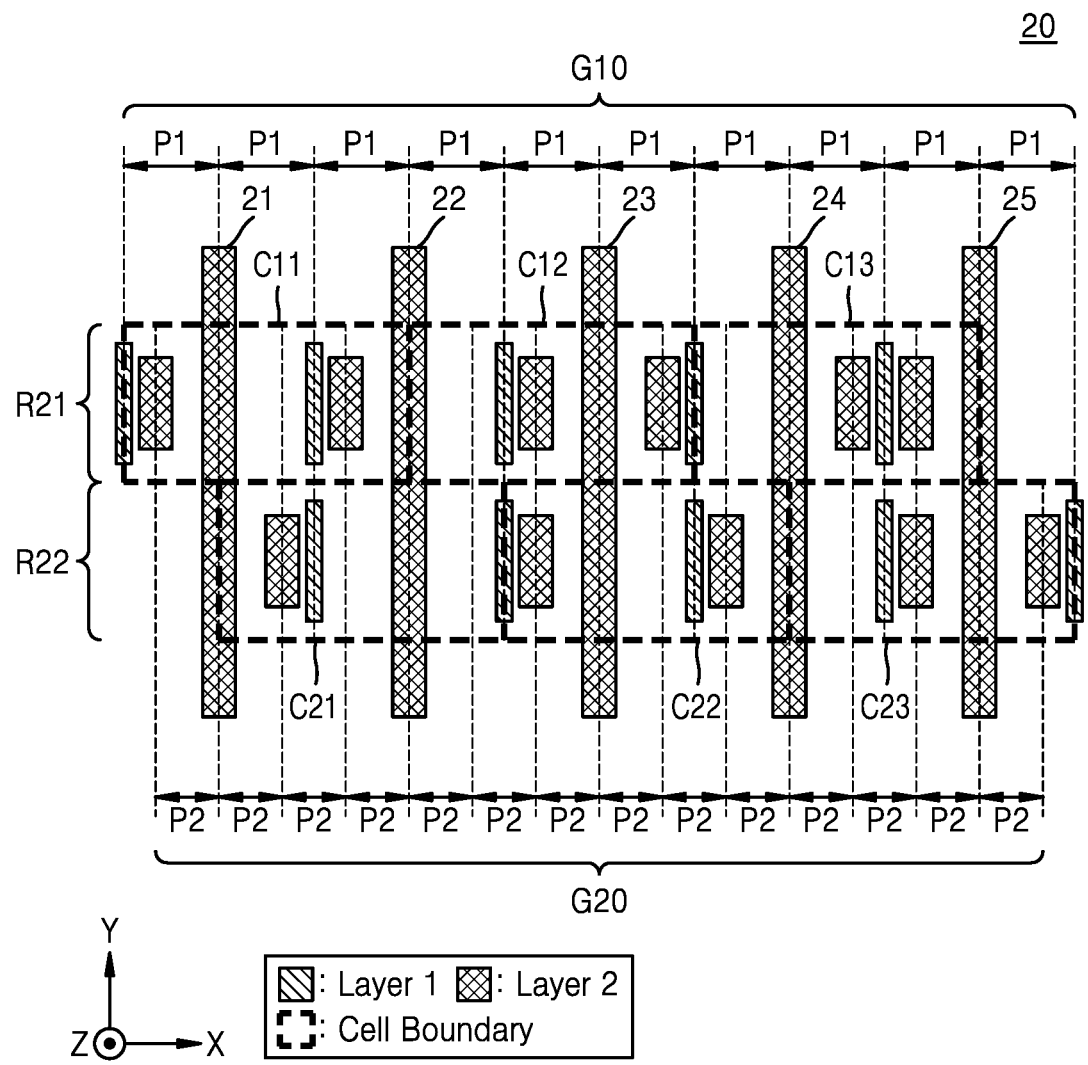
FIG. 2 is a plan view illustrating a layout of an integrated circuit according to an example embodiment.

FIG. 2 is a plan view illustrating a layout of an integrated circuit 20 according to an example embodiment. As illustrated in FIG. 2, the integrated circuit 20 may include standard cells C11, C12, and C13 arranged in a first row R21 and standard cells C21, C22, and C23 arranged in a second row R22. Widths (that is, lengths in the Y-axis direction) of the first row R21 and the second row R22 may be the same as or different from each other.

Referring to FIG. 2, patterns of a first layer may extend in the Y-axis direction according to a first grid G10 having a first pitch P1, and patterns of a second layer may extend in the Y-axis direction according to a second grid G20 having a second pitch P2. As described above with reference to FIGS. 1A and 1B, the patterns of the second layer extending on the second grid line overlapping the first grid line in the standard cell may be omitted. The integrated circuit 20 may include the patterns of the second layer extending across standard cells on the second grid line overlapping the first grid line. For example, as illustrated in FIG. 2, patterns 21 to 25 of the second layer may extend across the first row R21 and the second row R22 in the Y-axis direction on the second grid lines of the second grid G20 overlapping the first grid lines of the first grid G10. In some embodiments, the patterns 21 to 25 of the second layer may be connected to power rails extending in the X-axis direction on boundaries of the first row R21 and the second row R22, and the positive supply voltage VDD and the negative supply voltage VSS may be applied thereto, respectively.

Figure 3A:
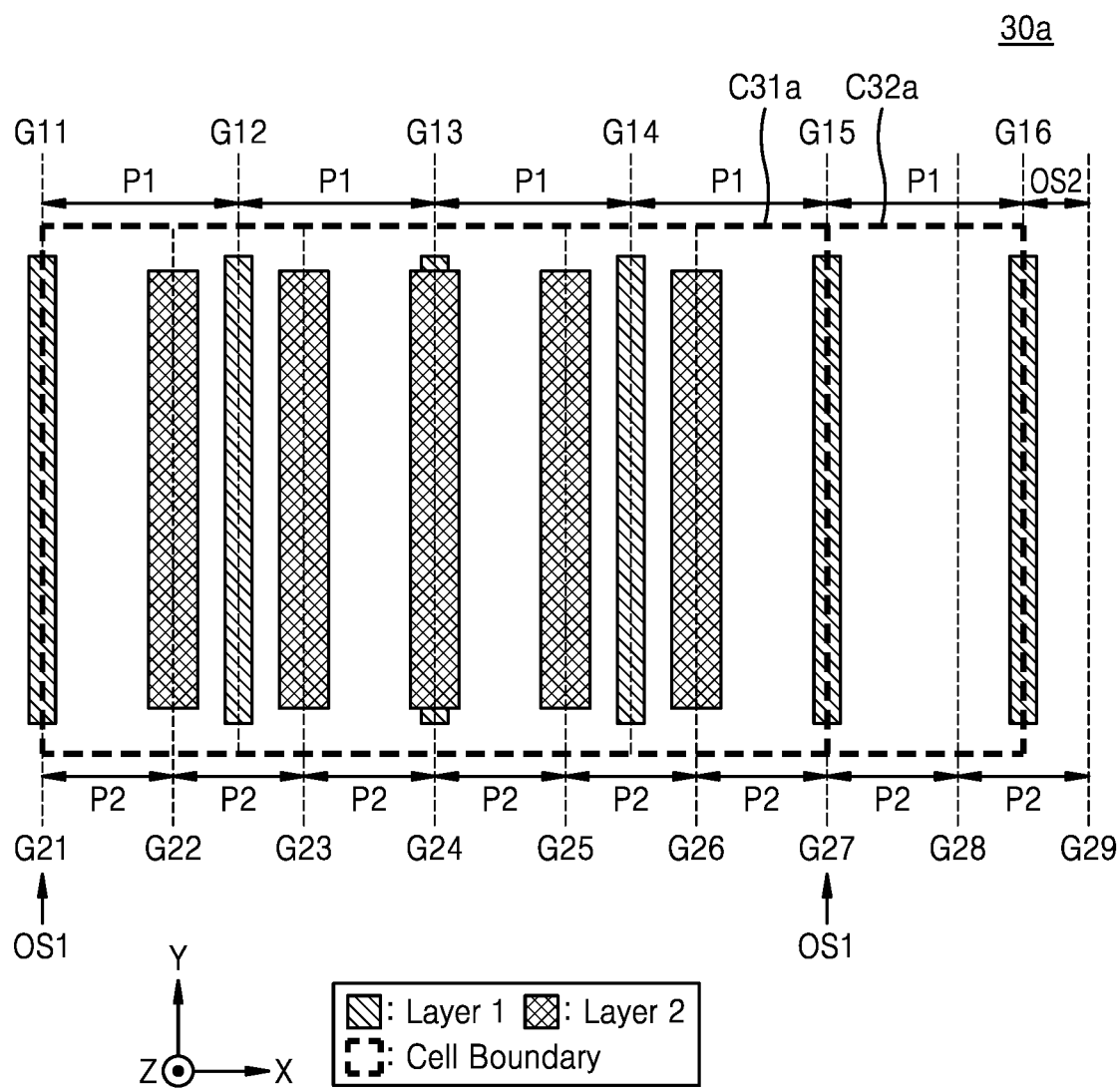
FIGS. 3A and 3B are plan views illustrating layouts of integrated circuits according to example embodiments.
Figure 3B:
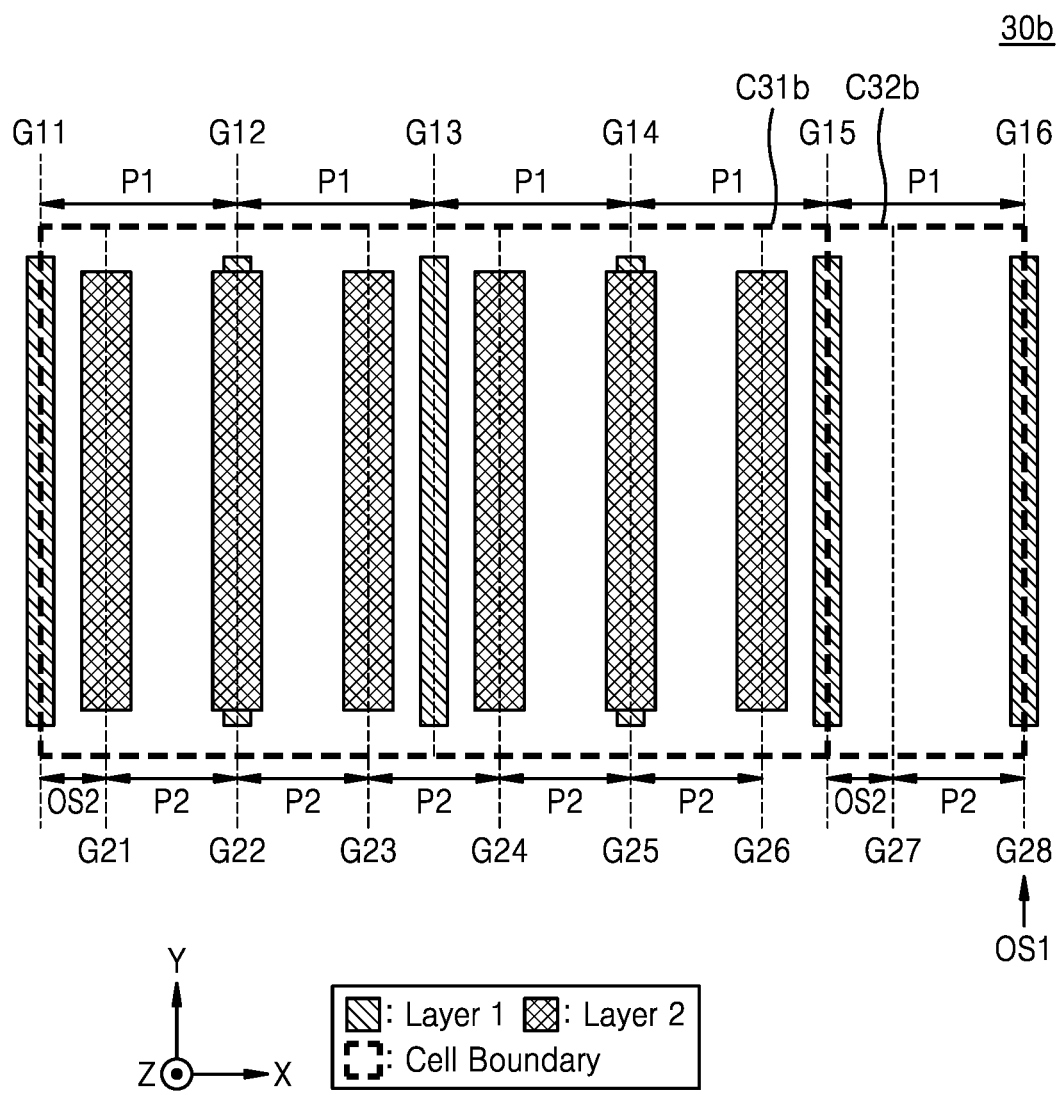

FIGS. 3A and 3B are plan views illustrating layouts of integrated circuits 30a and 30b according to example embodiments. Specifically, the plan views of FIGS. 3A and 3B illustrate patterns of a first layer and patterns of a second layer included in the integrated circuits 30a and 30b. In some embodiments, integrated circuits may each include a filler cell, and a grid offset may be changed in the filler cell. Accordingly, when only standard cells having a single grid offset are provided, the filler cell may be appropriately arranged. In some embodiments, as described above with reference to FIGS. 1A and 1B, the patterns of the second layer extending in the Y-axis direction on second grid lines overlapping first grid lines may be omitted in function cells C31*a* and C31*b* of FIGS. 3A and 3B.

Referring to FIG. 3A, the integrated circuit 30*a* may include the function cell C31*a* and a filler cell C32*a*. The function cell C31*a* and the filler cell C32*a* may include patterns of a first layer and patterns of a second layer. For example, the function cell C31*a* may include patterns extending in the Y-axis direction on first grid lines G11 to G15 in the first layer and include patterns extending in the Y-axis direction on second grid lines G22 to G26 in the second layer. Patterns of the first layer extending in the Y-axis direction on a boundary of the function cell C31*a*, that is, on the first grid lines G11 and G15, may be omitted. As illustrated in FIG. 3A, the first function cell C31*a* may have a first grid offset OS1 that is zero.

The filler cell C32*a* may include patterns extending in the Y-axis direction on the first grid lines G15 and G16 in the first layer. As described above with reference to FIGS. 1A and 1B, the patterns of the first layer extending in the Y-axis direction on the boundary of the filler cell C32*a*, that is, on the first grid lines G15 and G16, may be omitted. As illustrated in FIG. 3A, the filler cell C32*a* may have the first grid offset OS1, while a function cell having a second grid offset OS2 may be arranged on the right side of the filler cell C32*a*.

Referring to FIG. 3B, the integrated circuit 30*b* may include a function cell C31*b* and a filler cell C32*b*. The function cell C31*b* and the filler cell C32*b* may respectively include patterns of a first layer and patterns of a second layer. For example, the function cell C31*b* may include patterns extending in the Y-axis direction on first grid lines G1*l* to G15 in the first layer and include patterns extending in the Y-axis direction on second grid lines G21 to G26 in the second layer. Patterns of the first layer extending in the Y-axis direction on a boundary of the function cell C31*b*, that is, on the first grid lines G11 and G15, may be omitted. As illustrated in FIG. 3B, the first function cell C31*b* may have a first grid offset OS1 that is zero.

The filler cell C32*b* may include patterns extending in the Y-axis direction on the first grid lines G15 and G16 in the first layer. As described above with reference to FIGS. 1A and 1B, the patterns of the first layer extending in the Y-axis direction on the boundary of the filler cell C32*b*, that is, on the first grid lines G15 and G16, may be omitted. As illustrated in FIG. 3B, the filler cell C32*b* may have the second grid offset OS2, while a function cell having a first grid offset OS1 may be arranged on the right side of the filler cell C32*a*.

Figure 4A:
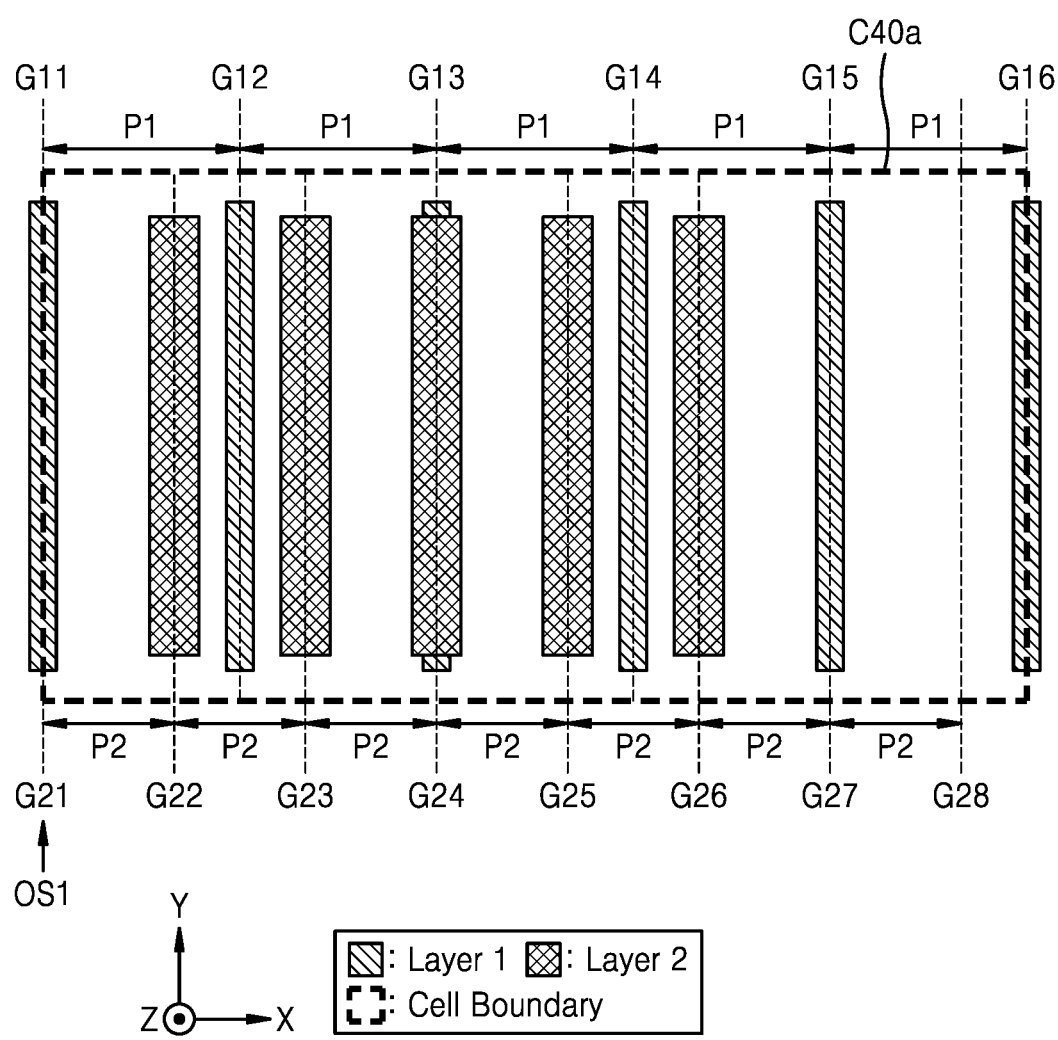
FIGS. 4A and 4B are plan views illustrating layouts of standard cells according to example embodiments.
Figure 4B:
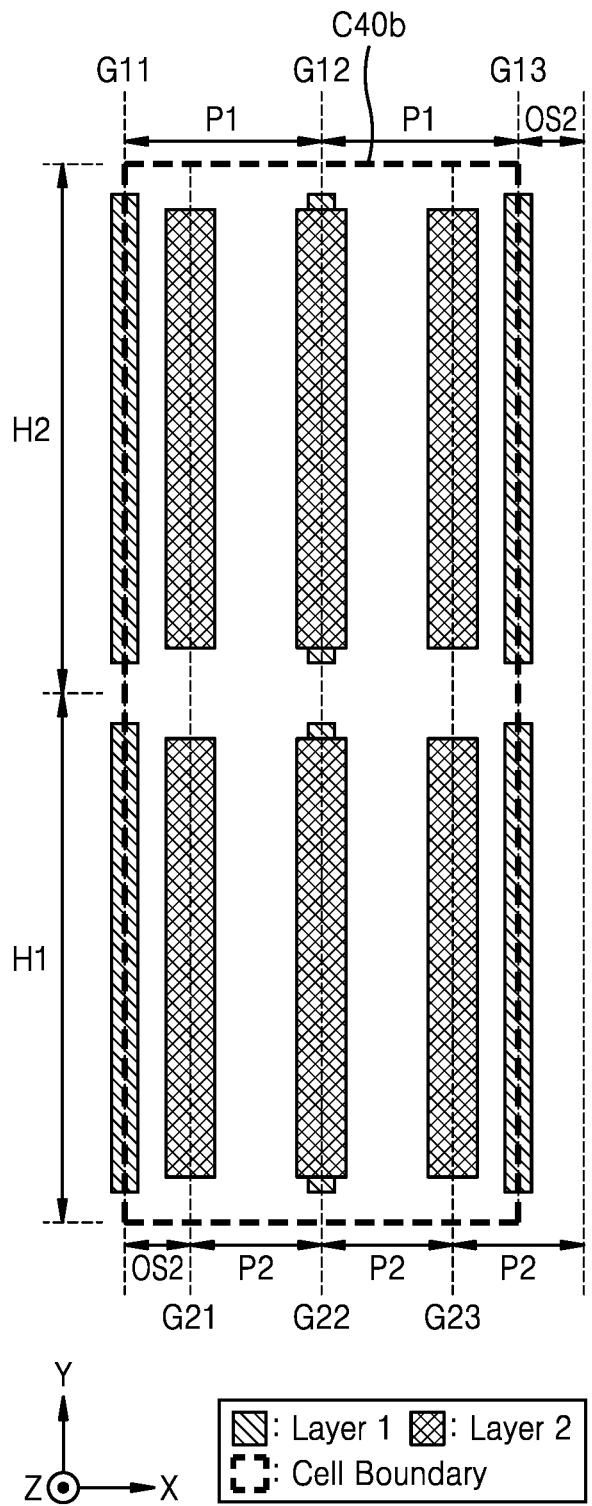

FIGS. 4A and 4B are plan views illustrating layouts of standard cells C40*a* and C40*b* according to example embodiments. Specifically, the standard cell C40*a* of FIG. 4A may correspond to the same circuit as the function cell C31*a* of FIG. 3A, and the standard cell C40*b* of FIG. 4B may correspond to the same circuit as the function cell C31*b* of FIG. 3B. In some embodiments, an integrated circuit may include standard cells that correspond to the same circuit and have the same grid offset but ending with different grid offsets. In some embodiments, as described above with reference to FIGS. 1A and 1B, patterns of the second layer extending in the Y-axis direction on the second grid lines overlapping the first grid lines may be omitted in the function cells C40*a* and C40*b* of FIGS. 4A and 4B.

Referring to FIG. 4A, the standard cell C40*a* may include the patterns of the first layer and the patterns of the second layer. For example, the standard cell C40*a* may include patterns extending in the Y-axis direction on first grid lines G11 to G16 in the first layer and include patterns extending in the Y-axis direction on the second grid lines G21 to G26 in the second layer. The patterns of the first layer extending in the Y-axis direction on a boundary of the standard cell C40*a*, that is, on the first grid lines G11 and G16, may be omitted. Compared with the example of FIG. 3A, the standard cell C40*a* of FIG. 4A may have a layout including a layout of the function cell C31*a* of FIG. 3A and a layout of the filler cell C32*a* of FIG. 3A. Accordingly, instead of the function cell C31*a* and the filler cell C32*a* of FIG. 3A, the standard cell C40*a* of FIG. 4A may be arranged. Similarly, a standard cell having a layout including a layout of the function cell C31*b* and a layout of the filler cell C32*b* of FIG. 3B may be defined, and instead of the function cell C31*b* and the filler cell C32*b* of FIG. 3B, a defined standard cell may be arranged.

Referring to FIG. 4B, the standard cell C40*b* may include the patterns of the first layer and the patterns of the second layer. For example, the standard cell C40*b* may include patterns extending in the Y-axis direction on first grid lines G11 to G13 in the first layer and include patterns extending in the Y-axis direction on second grid lines G21 to G23 in the second layer. The patterns of the first layer extending in the Y-axis direction on a boundary of the standard cell C40*b*, that is, on the first grid lines G11 and G13, may be omitted.

The standard cell C40*b* may correspond to the same circuit as the function cell C30*a* of FIG. 3A. The standard cell C40*b* may have a second grid offset OS2 that is different from the offset of the function cell C30*a* of FIG. 3A. In addition, differently from the function cell C30*b* of FIG. 3B, which is a single height cell, the standard cell C40*b* may be a multi-height cell. As illustrated in FIG. 4B, the standard cell C40*b* may be consecutively arranged in a row having a width of H1 and a row having a width of H2. H1 and H2 may be the same as or different from each other. Accordingly, instead of the function cell C31*b* of FIG. 3B, the standard cell C40*b* of FIG. 4B may be arranged.

FIGS. 5A to 5D are plan views illustrating layouts of standard cells C50*a*, C50*b*, C50*c*, and C50*d* according to example embodiments. Specifically, the plan views of FIGS. 5A to 5D illustrate patterns of a first layer and patterns of a second layer included in the standard cells C50*a*, C0*b*, C50*c*, and C50*d* respectively corresponding to the same circuits. As described above with reference to FIGS. 1A and 1B, an integrated circuit may include standard cells corresponding to the same circuits and each having different grid offsets.

In some embodiments, multi-patterning using additional masks instead of using a single exposure may be employed for small patterns and reduced space between the patterns. For example, in the standard cells C50*a*, C50*b*, C50*c*, and C50*d* of FIGS. 5A to 5D, patterns of a second layer may be formed by double patterning (e.g., patterning using two masks). The standard cells C50*a*, C50*b*, C50*c*, and C50*d* may include patterns corresponding to (e.g., formed using) a first mask, that is, first exposure patterns and patterns corresponding to (e.g., formed using) a second mask, that is, second exposure patterns, in the second layer. In some embodiments, an integrated circuit may include standard cells including patterns of a second layer that have the same grid offset but are formed differently according to multi-patterning. In the multi-patterning, patterns included in the same exposure pattern group (that is, a group of patterns corresponding to the same mask) may be referred to as patterns having the same color, and grouping the patterns based on the multi-patterning may be referred to as pattern coloring. For example, first exposure patterns included in a first exposure pattern group E1 may have the first color, and second exposure patterns included in a second exposure pattern group E2 may have a second color that is different from the first color. When adjacent patterns extending parallel to each other are included in the same pattern group, collision may occur, and coloring may be performed such that no collision occurs.

Figure 5A:
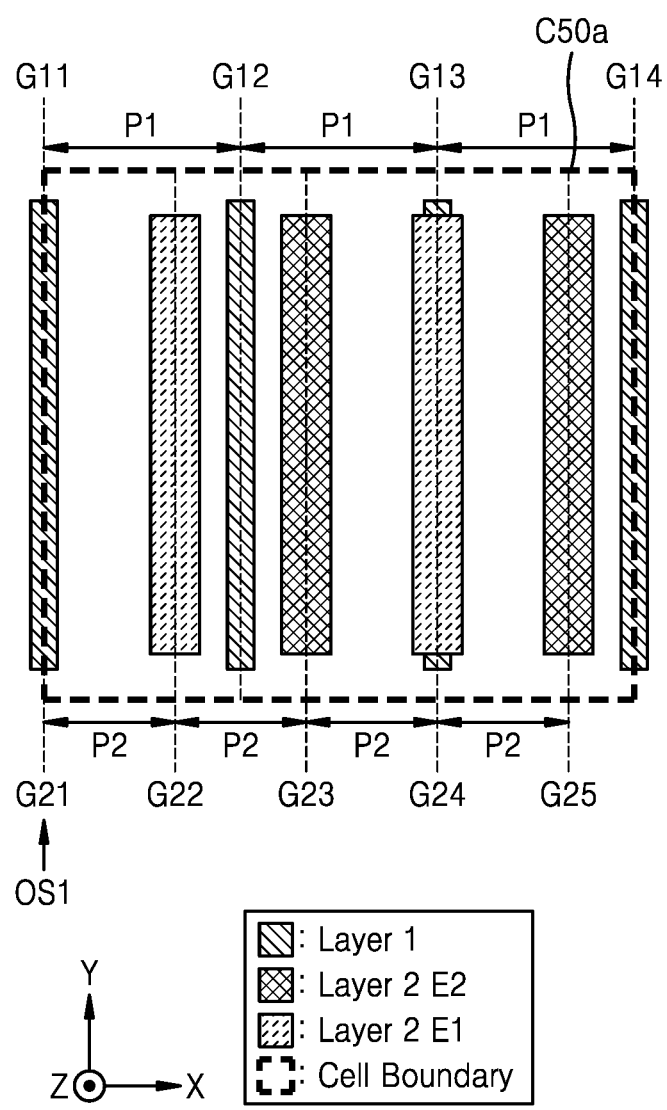
FIGS. 5A, 5B, 5C and 5D are plan views illustrating layouts of standard cells according to example embodiments.
Figure 5B:
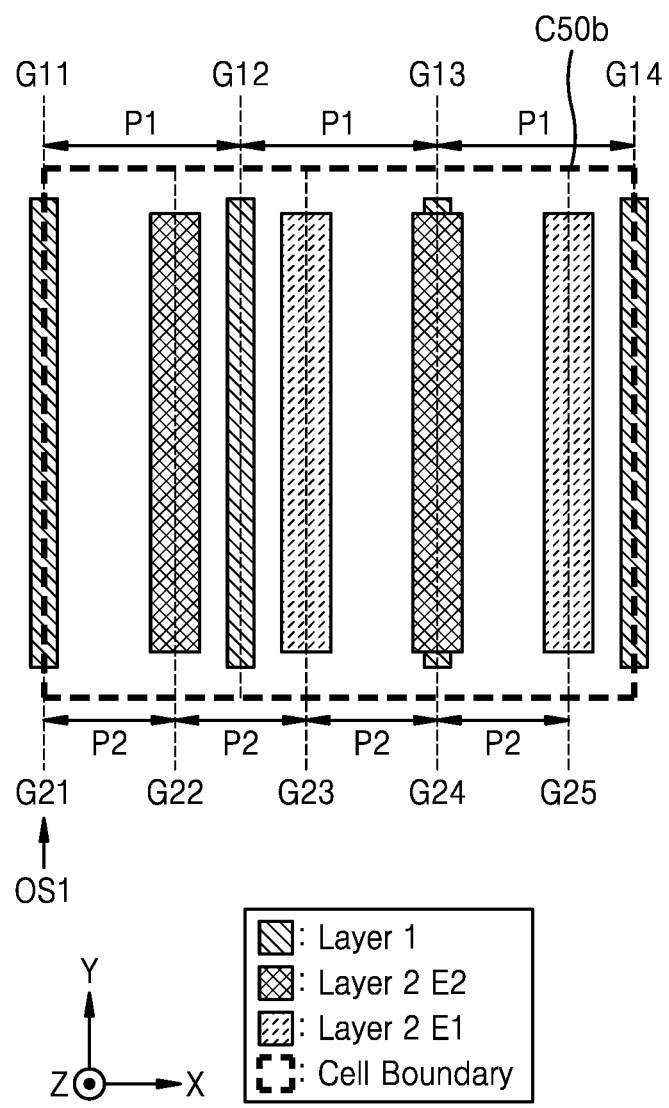

Referring to FIGS. 5A and 5B, the standard cells C50a and C50b may include the patterns of the first layer and the patterns of the second layer. For example, the standard cells C50a and C50b may include patterns extending in the Y-axis direction on first grid lines G11 to G14 in the first layer and include patterns extending in the Y-axis direction on second grid lines G21 to G25 in the second layer. The patterns extending in the Y-axis direction on boundaries of the standard cells C50a and C50b, that is, on the first grid lines G11 and G14, may be omitted.

The standard cells C50a and C50b of FIGS. 5A and 5B may have a first grid offset OS1 in common and may include differently arranged first and second exposure patterns. For example, as illustrated in FIG. 5A, the standard cell C50a may include the first exposure patterns extending in the Y-axis direction on the second grid lines G22 and G24 in the second layer and include the second exposure patterns extending in the Y-axis direction on the second grid lines G23 and G25 in the second layer. In addition, as illustrated in FIG. 5B, the standard cell C50b may include first exposure patterns extending in the Y-axis direction on the second grid lines G23 and G25 in the second layer and include second exposure patterns extending in the Y-axis direction on the second grid lines G22 and G24 in the second layer. Accordingly, when a standard cell having the first grid offset OS1 is required to be arranged, one of the standard cells C50a and C50b may be selected to be arranged by considering multi-patterning of an integrated circuit.

Figure 5C:
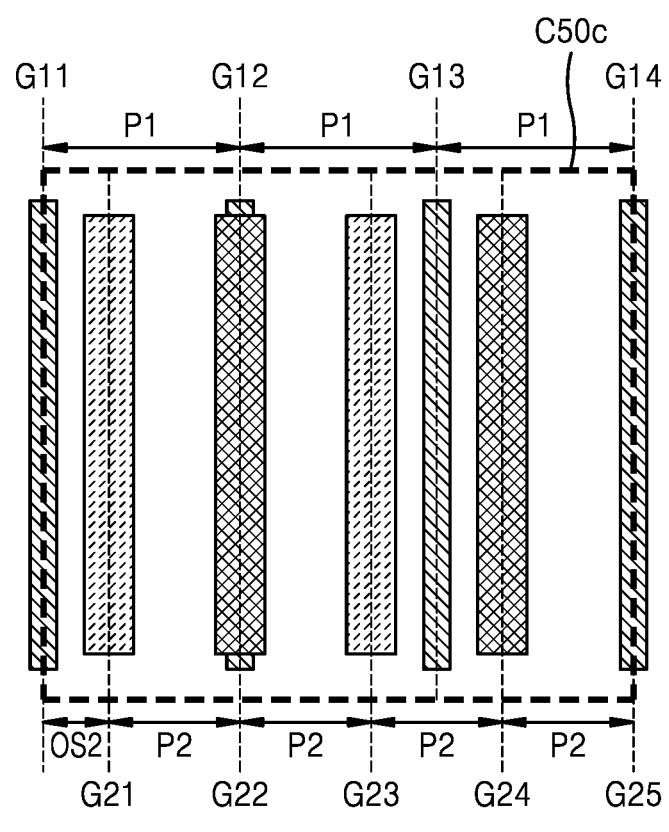
Figure 5D:
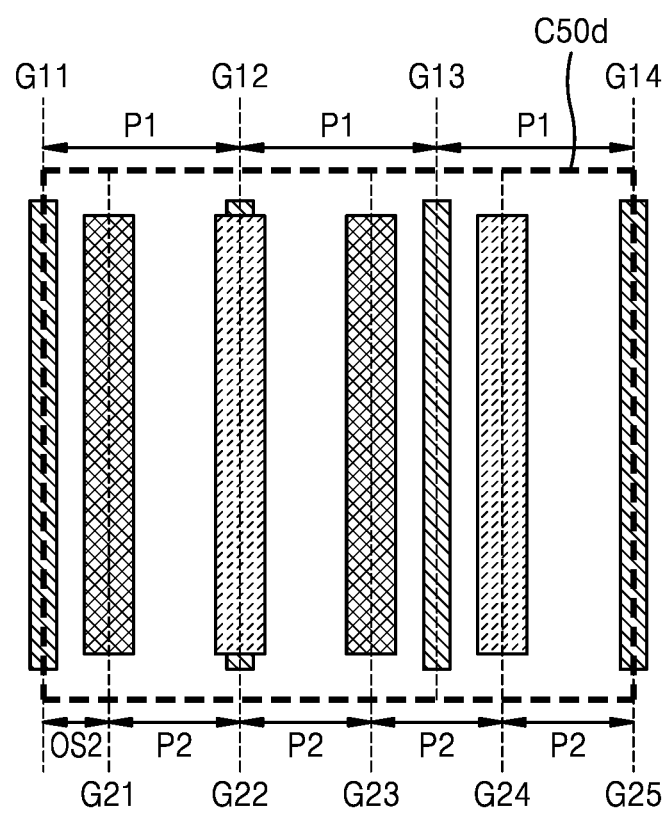

The standard cells C50c and C50d of FIGS. 5C and 5D may have a second grid offset OS2 in common and may include differently arranged first exposure patterns and second exposure patterns. For example, as illustrated in FIG. 5C, the standard cell C50c may include the first exposure patterns extending in the Y-axis direction on the second grid lines G21 and G23 in the second layer and include the second exposure patterns extending in the Y-axis direction on the second grid lines G22 and G24 in the second layer. In addition, as illustrated in FIG. 5D, the standard cell C50d may include the second exposure patterns extending in the Y-axis direction on the second grid lines G21 and G23 in the second layer and include the first exposure patterns extending in the Y-axis direction on the second grid lines G22 and G24 in the second layer. Accordingly, when a standard cell having the second grid offset OS2 is required to be arranged, one of the standard cells C50c and C50d may be selected to be arranged by considering multi-patterning of an integrated circuit.

Figure 6A:
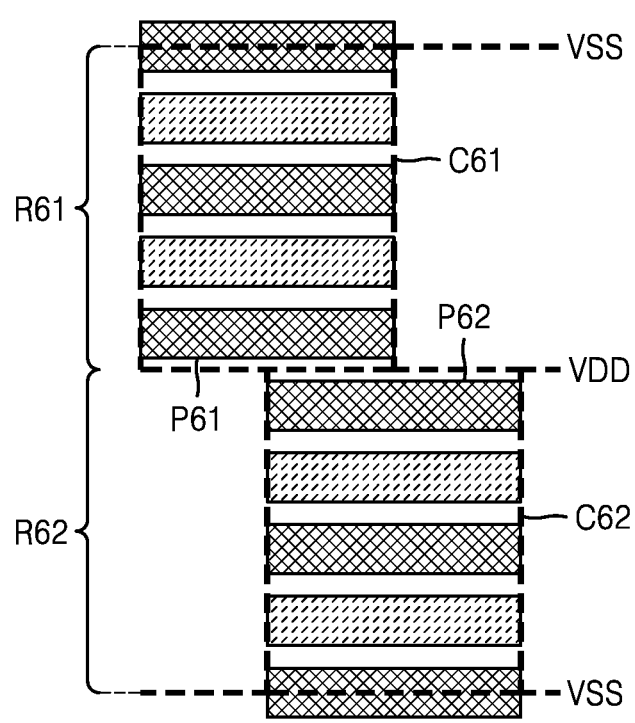
FIGS. 6A and 6B are plan views illustrating layouts of integrated circuits according to example embodiments.
Figure 6B:
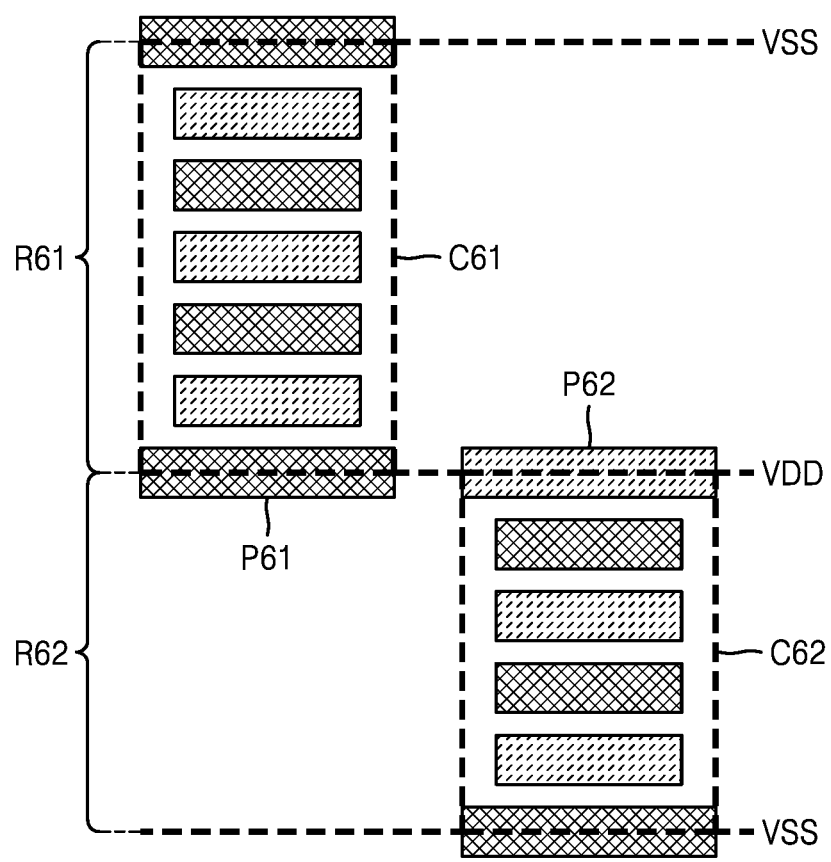

FIGS. 6A and 6B are plan views illustrating layouts of integrated circuits 60a and 60b according to example embodiments. Specifically, the plan views of FIGS. 6A and 6B illustrate patterns of a third layer included in the integrated circuits 60a and 60b. The third layer may be any conductive layer in which patterns extending in the X-axis direction are formed, as illustrated in FIGS. 6A and 6B. For example, the third layer may be one of wiring layers (or routing layers). In some embodiments, the third layer may be between the first and second layers described above. In some embodiments, the third layer may be over the first and second layers described above.

As illustrated in FIGS. 6A and 6B, the patterns of the third layer may extend in the X-axis direction, that is, in a direction in which rows extend. In addition, the patterns of the third layer may be formed by multi-patterning. For example, the patterns of the third layer may include first exposure patterns included in a first exposure pattern group E1 and second exposure patterns included in a second exposure pattern group E2.

Referring to FIG. 6A, the integrated circuit 60a may include a first cell C61 in a first row R61 and a second cell C62 in a second row R62. The first cell C61 and the second cell C62 may correspond to the same circuit and have a similar structure. For example, a power rail for the positive supply voltage VDD may extend in the X-axis direction on a boundary between the first row R61 and the second row R62, and a front-end-of-line (FEOL) of the first cell C61 and an FEOL of the second cell C62 may be flipped with respect to each other about a direction parallel to the X-axis.

In some embodiments, when a width (or a height of a cell) of a row is different from a multiple of a pitch between the patterns of the third layer, collision may occur in the multi-patterning of the third layer. For example, as illustrated in FIG. 6A, the first cell C61 may include a first pattern P61 adjacent to a boundary between the first row R61 and the second row R62, and the second cell C62 may include a second pattern P62 adjacent to the boundary between the first row R61 and the second row R62. The first pattern P61 and the second pattern P62 may be included in the second exposure pattern group E2, and the first pattern P61 may collide with the second pattern P62. Accordingly, coloring of the patterns of the third layer in the first cell C61 or the second cell C62 may be required to be corrected.

Referring to FIG. 6B, the integrated circuit 60b may include a first cell C61 in a first row R61 and a second cell C62 in a second row R62. In some embodiments, the integrated circuit 60b may include cells having different heights. For example, as illustrated in FIG. 6B, the first row R61 may have a greater width than the second row R62, and the first cell C61 may have a greater height than the second cell C62. In some embodiments, when the first cell C61 and the second cell C62 have the same function, the first cell C61 may have higher performance than the second cell C62, while the second cell C62 may have a smaller area than the first cell C61.

Due to the rows having different heights, collisions may occur in the multi-patterning of the third layer. For example, as illustrated in FIG. 6B, the first row R61 may have a width corresponding to six times the pitch between the patterns of the third layer, while the second row R62 may have a width corresponding to five times the pitch between the patterns of the third layer. The patterns of the third layer, which extend on boundaries of the first row R61 and are included in the first cell C61, may be included in the same exposure pattern group, that is, the first exposure pattern group E1. In addition, the patterns of the third layer, which extend on boundaries of the second row R62 and are included in the second cell C62, may be included in different exposure pattern groups, that is, the first exposure pattern group E1 and the second exposure pattern group E2, respectively. Accordingly, when the first cell C61 is adjacent to the second cell C62, the first pattern P61 included in the second exposure pattern group E2 may collide with the second pattern P62 included in the first exposure pattern group E1 at the boundary between the first row R61 and the second row R62.

As described above with reference to FIGS. 6A and 6B, collision of multi-patterning may occur at a boundary between standard cells respectively arranged in different rows, that is, at a boundary between rows. Hereinafter, a method and a structure for preventing collision at a boundary between rows will be described with reference to FIGS. 7A to 9B.

Figure 7A:
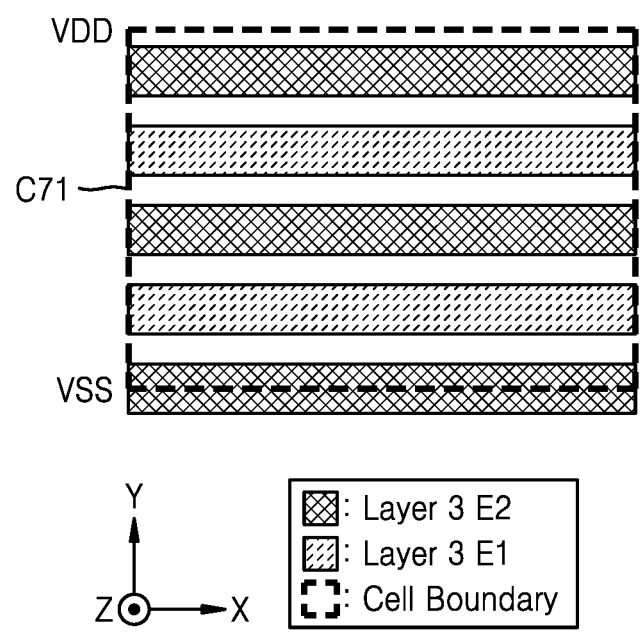
FIGS. 7A and 7B are plan views illustrating layouts of standard cells according to example embodiments.
Figure 7B:
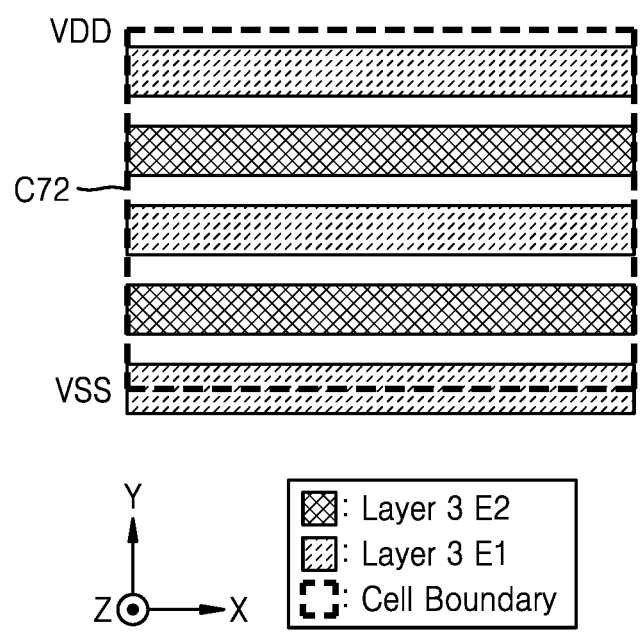

FIGS. 7A and 7B are plan views illustrating layouts of standard cells according to example embodiments. Specifically, the plan views of FIGS. 7A and 7B illustrate patterns of a third layer included in standard cells respectively corresponding to the same circuit.

In some embodiments, an integrated circuit may include standard cells corresponding to the same circuit, and the standard cells may respectively correspond to different colorings of the third layer. For example, a first cell C71 of FIG. 7A and a second cell C72 of FIG. 7B may correspond to the same circuit and have the same height. Patterns of a third layer in the first cell C71 and patterns of the third layer in the second cell C72 may correspond to different colorings.

An integrated circuit may include not only the first cell C71 and the second cell C72 but also a cell in which the first cell C71 is flipped about the X axis and a cell in which the second cell C72 is flipped about the X axis. Accordingly, a cell in a row adjacent to the first cell C71 toward the negative supply voltage VSS may correspond to a cell in which the first cell C71 is flipped about the X axis, and a cell in a row adjacent to the first cell C71 toward the positive supply voltage VDD may correspond to a cell in which the second cell C72 is flipped about the X axis. Similarly, a cell in a row adjacent to the second cell C72 toward the negative supply voltage VSS may correspond to a cell in which the second cell C72 is flipped about the X axis, and a cell in a row adjacent to the second cell C72 toward the positive supply voltage VDD may correspond to a cell in which the first cell C71 is flipped about the X axis. Accordingly, the collision described above with reference to FIG. 6A may not occur in the third layer.

Figure 8A:
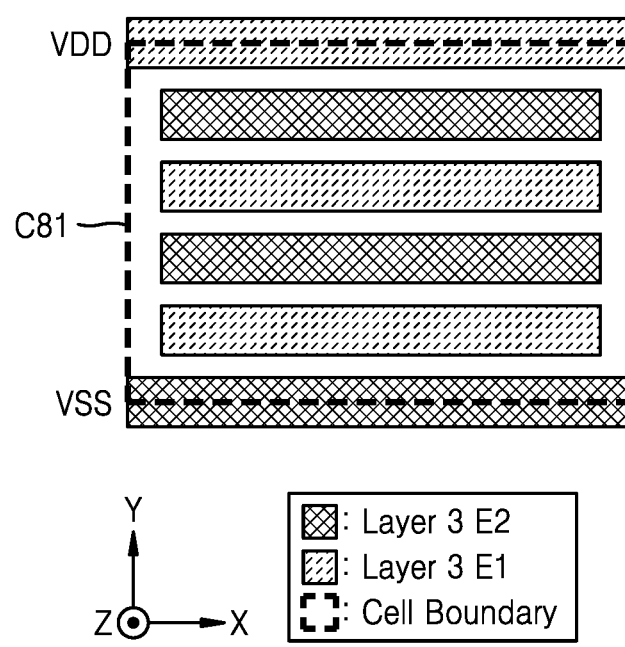
FIGS. 8A and 8B are plan views illustrating layouts of standard cells according to example embodiments.
Figure 8B:
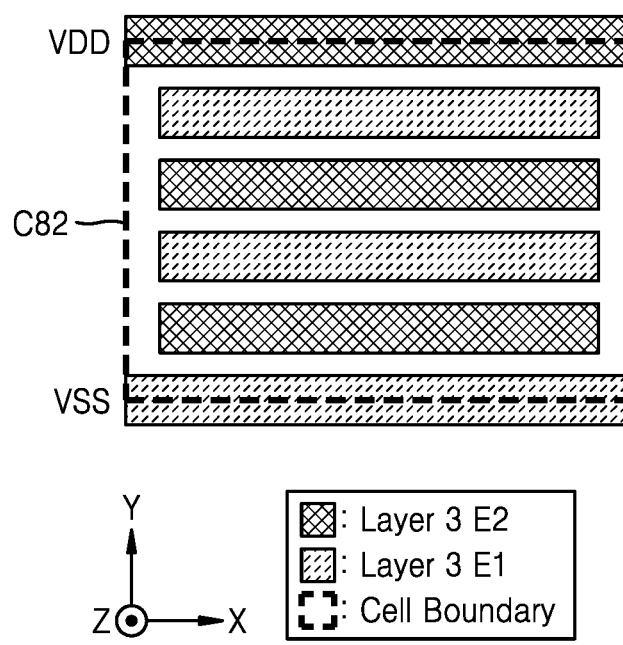

FIGS. 8A and 8B are plan views illustrating layouts of standard cells according to example embodiments. Specifically, the plan views of FIGS. 8A and 8B illustrate patterns of a third layer included in standard cells respectively corresponding to the same circuit.

In some embodiments, an integrated circuit may include standard cells corresponding to the same circuit, and the standard cells may respectively correspond to different colorings of the third layer. For example, a first cell C81 of FIG. 8A and a second cell C82 of FIG. 8B may correspond to the same circuit and have the same height. Patterns of the third layer in the first cell C81 and patterns of the third layer in the second cell C82 may correspond to different colorings.

An integrated circuit may include not only the first cell C81 and the second cell C82 but also a cell in which the first cell C81 is flipped about the X axis and a cell in which the second cell C82 is flipped about the X axis. In FIG. 6B, the second cell C82 of FIG. 8B may be in a second row R62, and thus, collision may not occur in the integrated circuit 60b of FIG. 6B. In addition, the first cell C81 may be in a row adjacent to the first row R61 toward the negative supply voltage VSS in FIG. 6B, and thus, collision may not occur in the integrated circuit 60b of FIG. 6B.

Figure 9A:
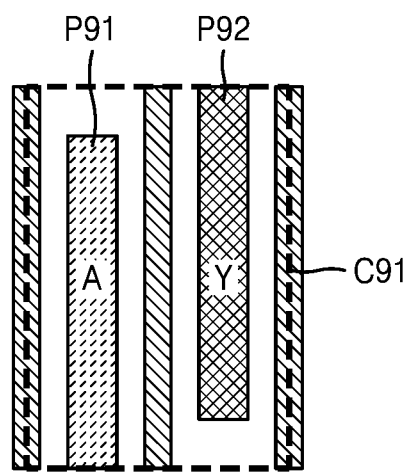
FIGS. 9A and 9B are plan views illustrating layouts of standard cells according to example embodiments.
Figure 9B:
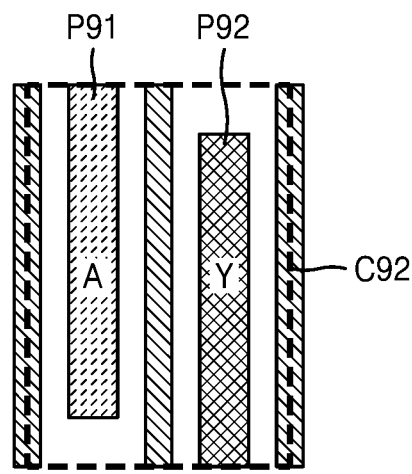
Figure 9B:
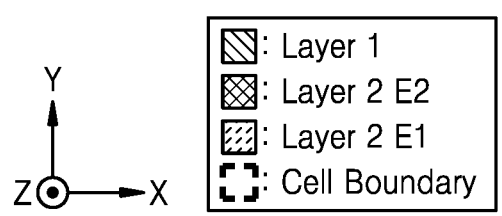

FIGS. 9A and 9B are plan views illustrating layouts of standard cells according to example embodiments. Specifically, the plan views of FIGS. 9A and 9B illustrate patterns of a first layer and a second layer included in standard cells respectively corresponding to the same circuit.

In some embodiments, an integrated circuit may include standard cells corresponding to the same circuit, and the standard cells may respectively correspond to different colorings of the second layer. For example, a first cell C91 of FIG. 9A and a second cell C92 of FIG. 9B may correspond to the same circuit and have the same height. The first cell C91 may include a first pattern P91 and a second pattern P92 respectively corresponding to a node A and a node Y of a circuit in the second layer, and the first pattern P91 and the second pattern P92 may be included respectively in a first exposure pattern group E1 and the second exposure pattern group E2 of the second layer. In addition, the second cell C92 may include the first pattern P91 and the second pattern P92 respectively corresponding to the node A and the node Y of a circuit in the second layer, and the first pattern P91 and the second pattern P92 may be included respectively in the second exposure pattern group E2 and the first exposure pattern group E1 of the second layer. An integrated circuit may include the first cell C91 and the second cell C92, and either the first cell C91 or the second cell C92 may be arranged depending on colorings of the second layers in standard cells arranged in adjacent rows. Accordingly, collision of the second layers may not occur at a boundary between rows.

Patterns included in the first exposure pattern group E1 and patterns included in the second exposure pattern group E2 may be differently separated from boundaries of cells. For example, as illustrated in FIG. 9A, the first pattern P91 of the first cell C91 may be separated from a boundary on a +Y-side among boundaries parallel to the X axis of the first cell C91 and may be in contact with a boundary on a −Y side. In addition, the second pattern P92 of the first cell C91 may be in contact with the boundary on the +Y side among the boundaries parallel to the X axis of the first cell C91 and may be separated from the boundary on the −Y side.

Figure 10A:
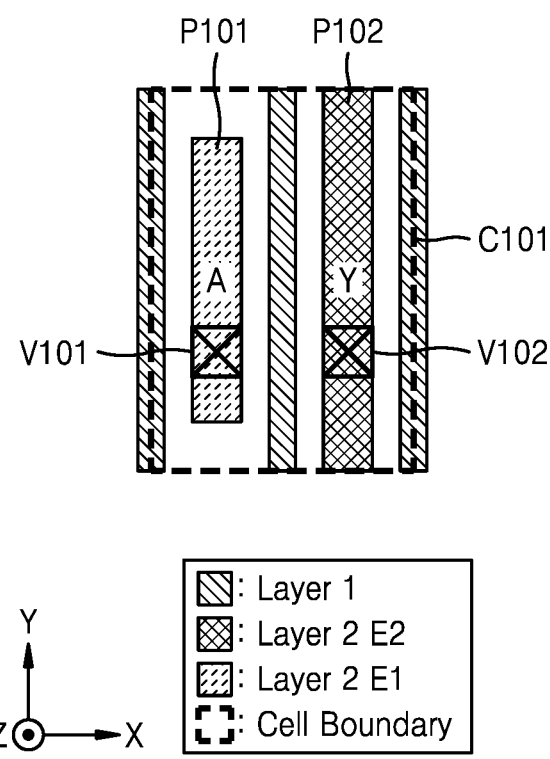
FIGS. 10A and 10B are plan views illustrating layouts of standard cells according to example embodiments.
Figure 10B:
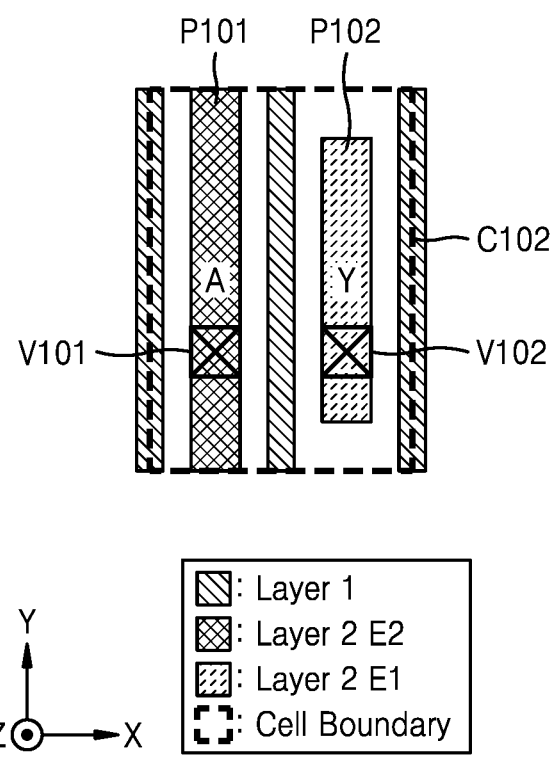

FIGS. 10A and 10B are plan views illustrating layouts of standard cells according to example embodiments. Specifically, the plan views of FIGS. 10A and 10B illustrate patterns of first and second layers included in standard cells respectively corresponding to the same circuit. Hereinafter, in describing FIGS. 10A and 10B, descriptions, which overlap the descriptions of FIGS. 9A and 9B, are omitted.

A first cell C101 of FIG. 10A and a second cell C102 of FIG. 10B may correspond to the same circuit and have the same height. The first cell C101 may include a first pattern P101 and a second pattern P102 respectively corresponding to a node A and a node Y of a circuit in the second layer, and the first pattern P101 and the second pattern P102 may be included respectively in a first exposure pattern group E1 and a second exposure pattern group E2 of the second layer. In addition, the second cell C102 may include the first pattern P101 and the second pattern P102 respectively corresponding to the node A and the node Y of the circuit in the second layer, and the first pattern P101 and the second pattern P102 may be included respectively in the second exposure pattern group E2 and the first exposure pattern group E1 of the second layer. An integrated circuit may include the first cell C101 and the second cell C102, and either the first cell C101 or the second cell C102 may be arranged depending on colorings of the second layers in standard cells arranged in adjacent rows. Accordingly, collision of the second layers may not occur at a boundary between rows.

In some embodiments, exposure pattern groups of multi-patterning may each correspond to different design rules due to, for example, difficulty, efficiency, cost, and so on of a semiconductor process as well as performance of an integrated circuit. For example, first exposure patterns of the first exposure pattern group E1 may be designed to comply with a first design rule defining more relaxed constraints, such as a less minimum pattern length, a smaller interpattern space, and a narrower via margin, while second exposure patterns of the second exposure pattern group E2 may be designed to comply a second design rule defining stricter constraints, such as a larger minimum pattern length, a larger interpattern space, and a wider via margin. A via margin may be referred to as a pattern area around a via required for the via to be connected electrically and safely to a pattern.

Each of the first cell C101 and the second cell C102 may further include a first via V101 and a second via V102 each formed in a via layer below the second layer and respectively connected to a first pattern P101 and a second pattern P102. The first pattern P101 of FIG. 10A and the second pattern P102 of FIG. 10B, which are included in the first exposure pattern group E1, may have smaller via margins than the second pattern P102 of FIG. 10A and the first pattern P101 of FIG. 10B, which are included in the second exposure pattern group E2.

Figure 11A:
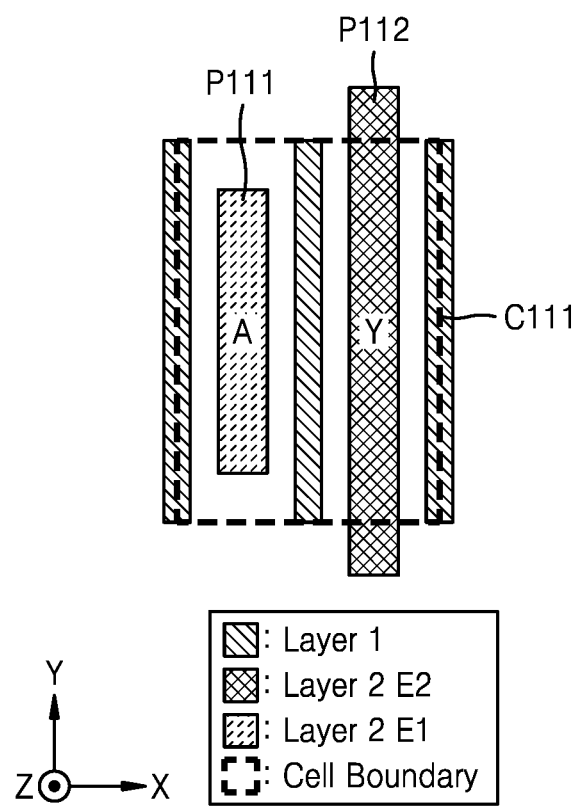
FIGS. 11A and 11B are plan views illustrating layouts of standard cells according to example embodiments.
Figure 11B:
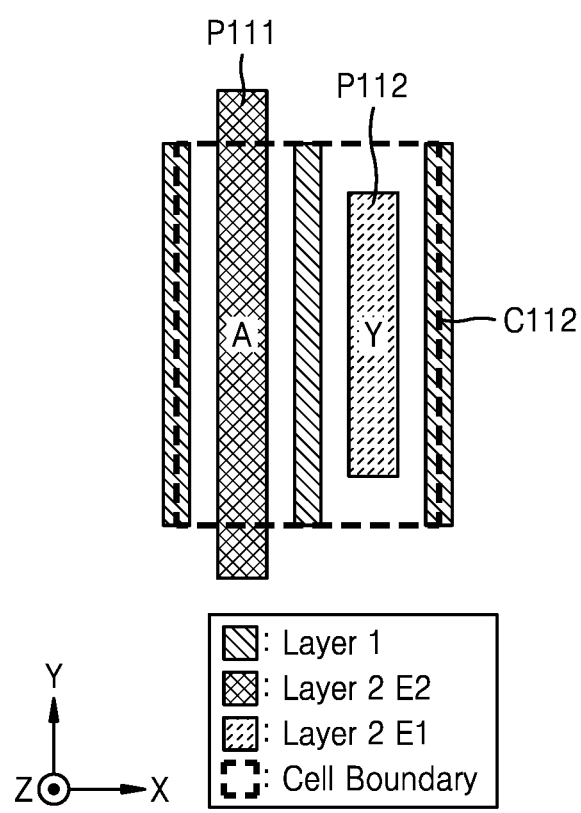

FIGS. 11A and 11B are plan views illustrating layouts of standard cells according to example embodiments. Specifically, the plan views of FIGS. 11A and 11B illustrate patterns of first and second layers included in standard cells respectively corresponding to the same circuit. Hereinafter, in describing FIGS. 11A and 11B, descriptions, which overlap the descriptions of FIGS. 10A and 10B, are omitted.

A first cell C111 of FIG. 11A and a second cell C112 of FIG. 11B may correspond to the same circuit and have the same height. The first cell C111 may include a first pattern P111 and a second pattern P112 respectively corresponding to a node A and a node Y of a circuit in the second layer, and the first pattern P111 and the second pattern P112 may be included respectively in a first exposure pattern group E1 and a second exposure pattern group E2 of the second layer. In addition, the second cell C112 may include a first pattern P111 and a second pattern P112 respectively corresponding to the node A and the node Y of the circuit in the second layer, and the first pattern P111 and the second pattern P112 may be included respectively in the first exposure pattern group E1 and the second exposure pattern group E2 in the second layer. An integrated circuit may include the first cell C111 and the second cell C112, and the first cell C111 or the second cell C112 may be arranged depending on colorings of the second layers for standard cells arranged in adjacent rows. Accordingly, collision of the second layers may not occur at a boundary between rows.

As semiconductor processes advance, a height of a standard cell may be reduced, and thus, the smallest length of a pattern may be reduced. As described above with reference to FIGS. 9A and 9B, the first exposure patterns of the first exposure pattern group E1 may be designed to comply with a first design rule defining more relaxed constraints, while the second exposure patterns of the second exposure pattern group E2 may be designed to comply with a second design rule defining more strict constraints. In some embodiments, the second design rule may define the smallest length greater than a height of a standard cell. For example, as illustrated in FIGS. 11A and 11B, the second pattern P112 of the first cell C111 may extend longer than a height of the first cell C111, and the first pattern P111 of the second cell C112 may extend longer than a height of the second cell C112. Accordingly, cells adjacent to the first cell C111 or the second cell C112 may be limited, and an integrated circuit may include standard cells corresponding to the same circuit but each having different colorings of the second layer.

Figure 12A:
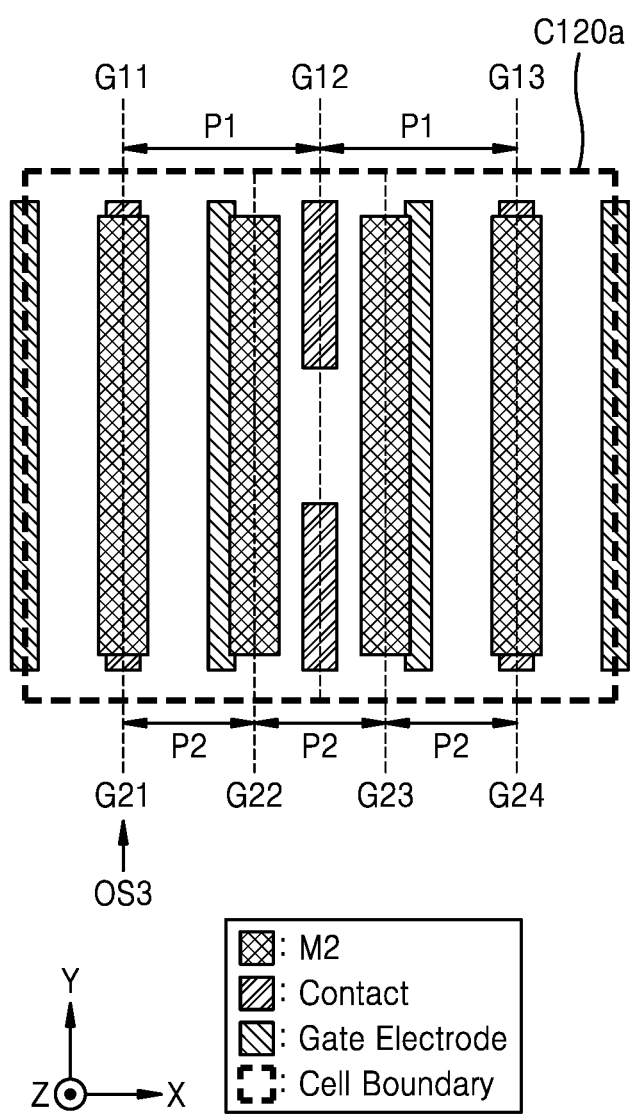
FIGS. 12A and 12B are plan views illustrating layouts of standard cells according to example embodiments.
Figure 12B:
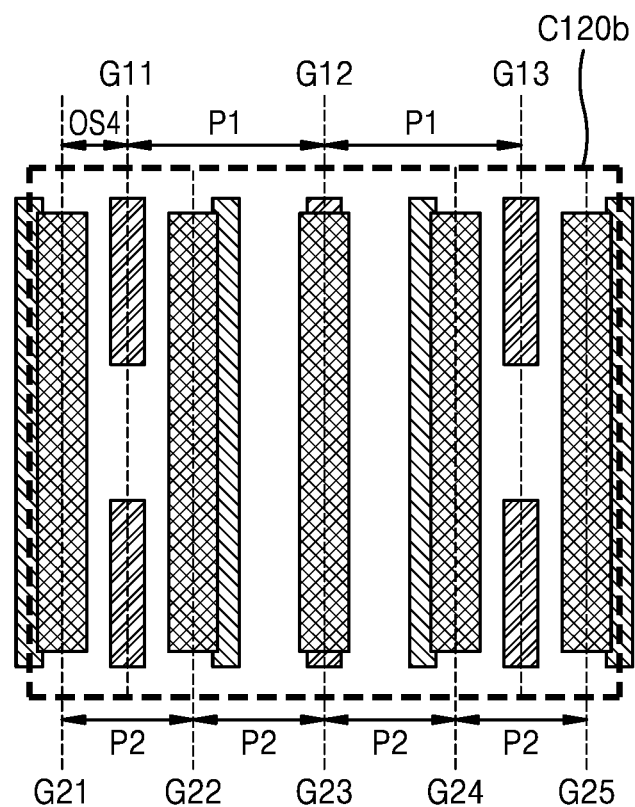

FIGS. 12A and 12B are plan views illustrating layouts of standard cells C120a and C120b according to example embodiments. Specifically, the plan views of FIGS. 12A and 12B illustrate patterns of first and second layers included in the standard cells C120a and C120b respectively corresponding to the same circuit. As described above with reference to FIGS. 1A and 1B, an integrated circuit may include standard cells corresponding to the same circuits and each having different grid offsets.

In the example of FIGS. 12A and 12B, the first layer may be a contact layer, and the second layer may be an M2 layer. As described below with reference to FIGS. 13A to 13F, the contact layer may refer to a layer in which patterns connected to a device, that is, contacts, are formed, and may include two or more sub-layers. The M2 layer may be one of upper wiring layers of the contact layer. The standard cells C120a and C120b may include gate electrodes extending in the Y-axis direction and include contacts extending in the Y-axis direction on first grid lines G11 to G13 between the gate electrodes. Accordingly, a pitch between the gate electrodes and a pitch between the contacts may be equal to each other as a first pitch P1 (or CPP). The standard cells C120a and C120b may each include M2 patterns extending in the Y-axis direction on second grid lines G21 to G24.

As illustrated in FIGS. 12A and 12B, the first pitch P1 may be greater than a second pitch P2, and a ratio between the first pitch P1 and the second pitch P2 may be 3:2. Accordingly, the standard cells C120a and C120b may have different grid offsets. For example, the standard cell C120a of FIG. 12A may have a third grid offset OS3 that is zero, while the standard cell C120b of FIG. 12B may have a positive fourth grid offset OS4.

FIGS. 13A to 13F are cross-sectional views illustrating examples of cross-sections of integrated circuits according to example embodiments. Specifically, the cross-sectional views of FIGS. 13A to 13F illustrate examples of contacts included in an integrated circuit. In some embodiments, a first layer may be a contact layer in which contacts described below with reference to FIGS. 13A to 13F are formed or be a sub-layer included in the contact layer. Hereinafter, in describing FIGS. 13A to 13F, redundant descriptions are omitted.

Figure 13A:
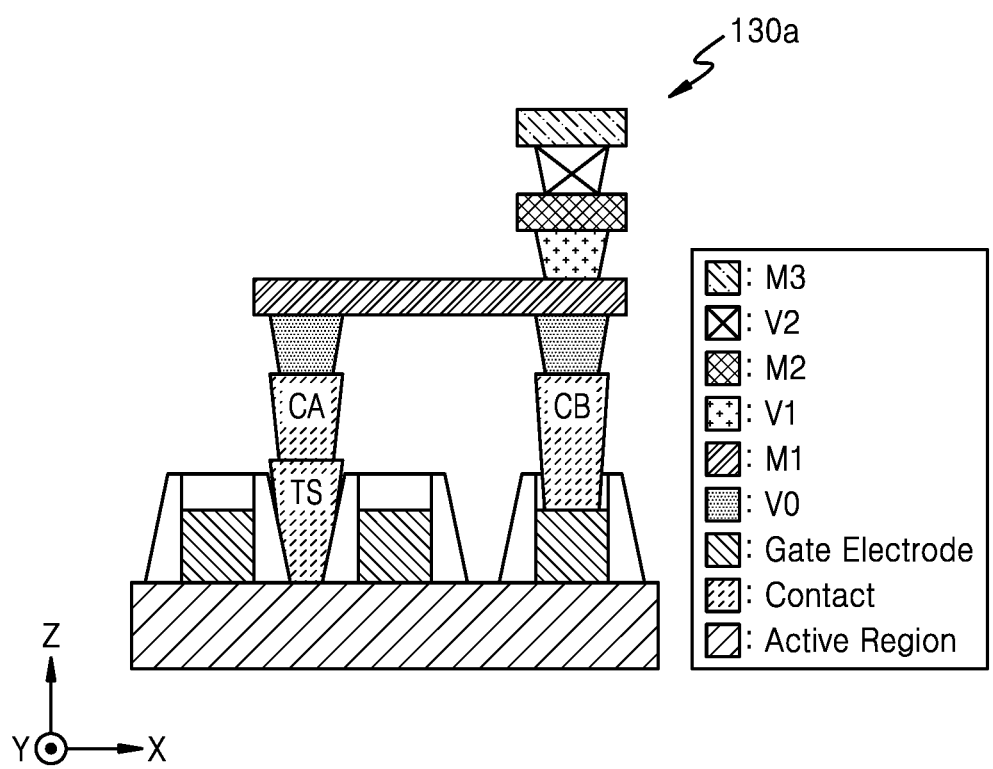
FIGS. 13A, 13B, 13C, 13D, 13E and 13F are cross-sectional views illustrating examples of cross-sections of integrated circuits according to example embodiments.

Referring to FIG. 13A, an integrated circuit 130a may include gate electrodes extending in the Y-axis direction. One of the gate electrodes may be connected to a gate contact CB, and the gate contact CB may be connected to a pattern of an M1 layer, that is, an M1 pattern, through a via of a V0 layer. The M1 layer may correspond to a wiring layer closest to the contact (e.g., the gate contact CB). The M1 pattern may be connected to a pattern of an M2 layer, that is, an M2 pattern, through a via of a V1 layer. The M2 layer may correspond to a wiring layer second closest to the contact (e.g., the gate contact CB). Patterns of the contact layer, the via layer, and the wiring layer may include any conductive material. For example, the contact may include W, Co and/or Mo, and so on, and patterns of the via and the wiring layer may include Cu and/or Ru, and so on. Between the gate electrodes, a source or a drain may be connected to trench silicide (TS), and a diffusion contact CA may be connected to the TS. The diffusion contact CA may be connected to the M1 pattern through the via of the V0 layer. That is, the integrated circuit 130a may use contacts formed in two sub-layers, to connect a source or a drain, that is, a diffusion region, to the M1 pattern.

In some embodiments, the wiring layers may each include patterns extending in different directions. For example, the M1 layer may include patterns extending in the X-axis direction, while the M2 layer adjacent to the M1 layer may include patterns extending in the Y-axis direction. In addition, a wiring layer (that is, an M3 layer) adjacent to the M2 layer may include patterns extending in the X-axis direction again. In some embodiments, patterns of the wiring layer may each have a length greater than or equal to a pitch between the gate electrodes, that is, CPP.

Figure 13B:
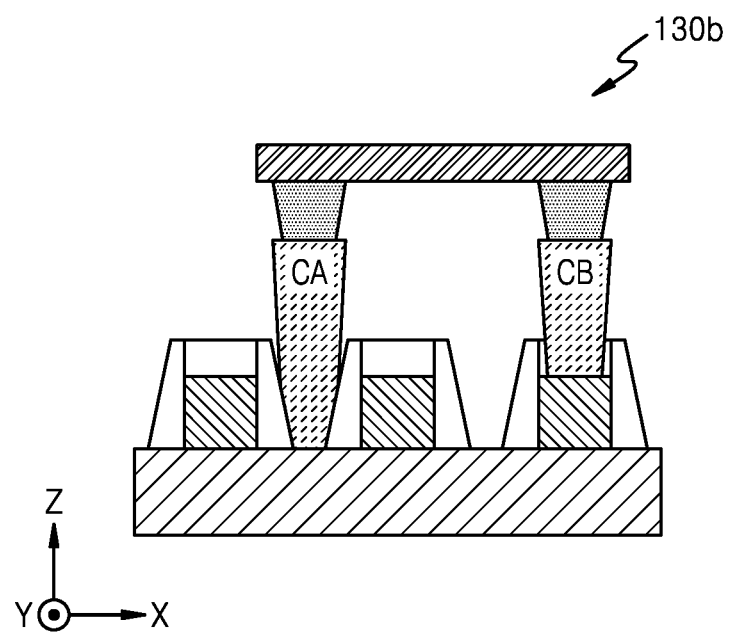

Referring to FIG. 13B, an integrated circuit 130b may include gate electrodes extending in the Y-axis direction, and one of the gate electrodes may be connected to an M1 pattern through a gate contact CB and a via of a V0 layer. In addition, a source or a drain between the gate electrodes may be connected to the M1 pattern through a diffusion contact CA and the via of the V0 layer.

Figure 13C:
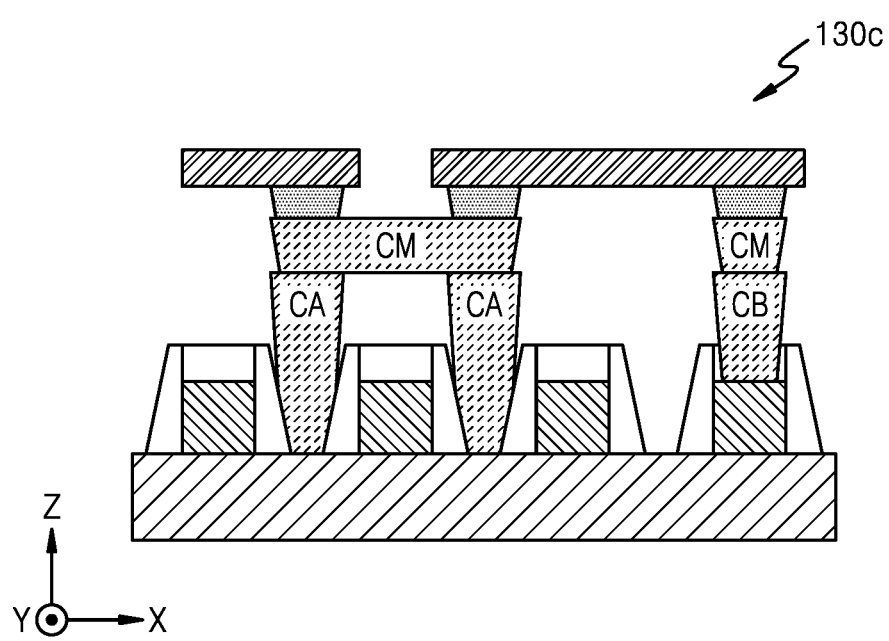

Referring to FIG. 13C, an integrated circuit 130c may include gate electrodes extending in the Y-axis direction, and one of the gate electrodes may be connected to an M1 pattern through a gate contact CB, an upper contact CM, and a via of a V0 layer. In addition, a source or a drain between the gate electrodes may be connected to the M1 pattern through a diffusion contact CA, the upper contact CM, and the via of the V0 layer. As illustrated in FIG. 13C, the upper contact CM may connect the gate contact to the diffusion contact.

Figure 13D:
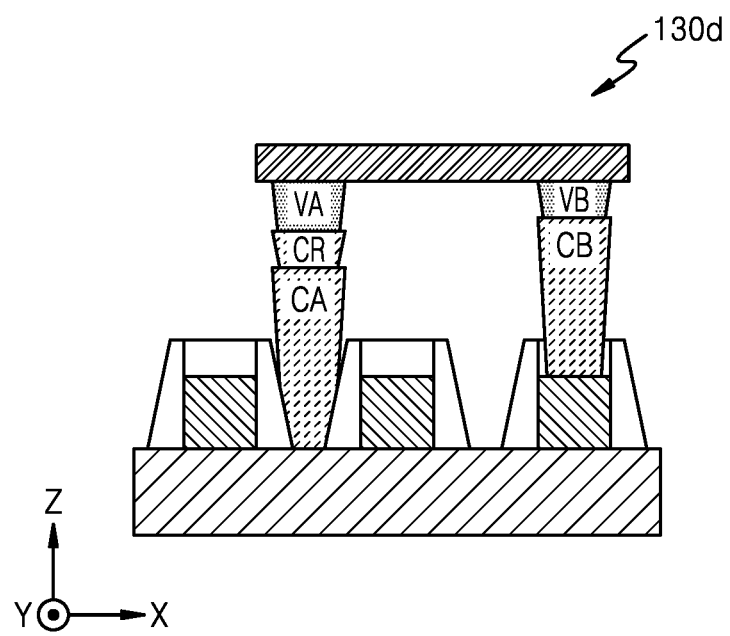

Referring to FIG. 13D, an integrated circuit 130d may include gate electrodes extending in the Y-axis direction, and one of the gate electrodes may be connected to an M1 pattern through a gate contact CB and a gate via VB. In addition, a source or a drain between the gate electrodes may be connected to the M1 pattern through a diffusion contact CA, an upper contact CR, and a diffusion via VA.

Figure 13E:
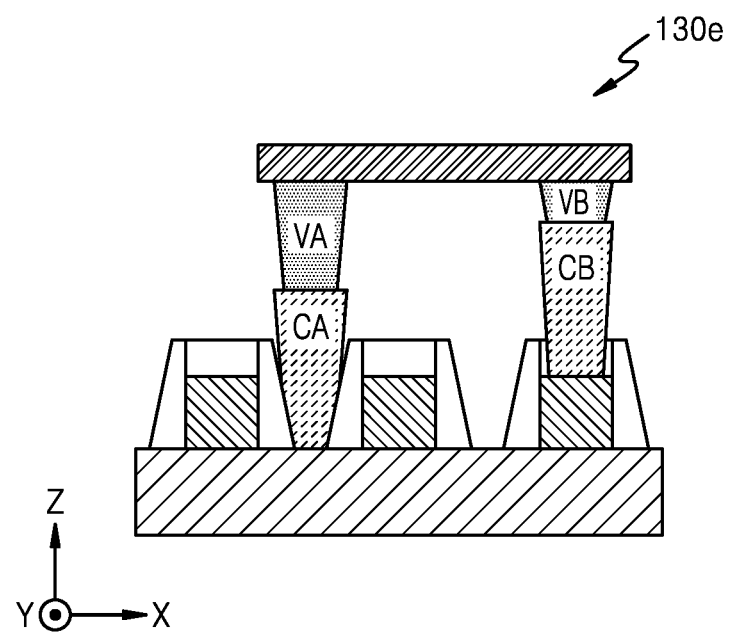

Referring to FIG. 13E, an integrated circuit 130e may include gate electrodes extending in the Y-axis direction, and one of the gate electrodes may be connected to an M1 pattern through a gate contact CB and a gate via VB. In addition, a source or a drain between the gate electrodes may be connected to the M1 pattern through a diffusion contact CA and a diffusion via VA.

Figure 13F:
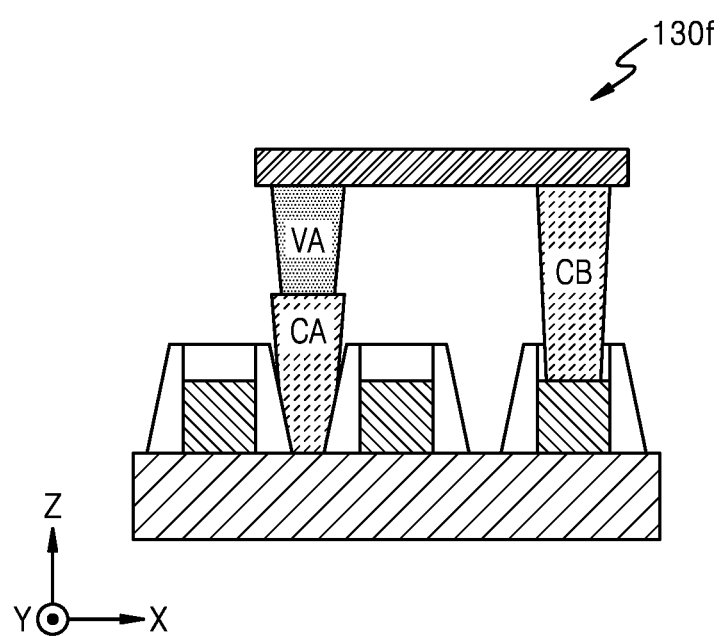

Referring to FIG. 13F, an integrated circuit 130f may include gate electrodes extending in the Y-axis direction, and one of the gate electrodes may be connected to an M1 pattern through a gate contact CB. In addition, a source or a drain between the gate electrodes may be connected to the M1 pattern through a diffusion contact CA and a diffusion via VA.

Figure 14A:
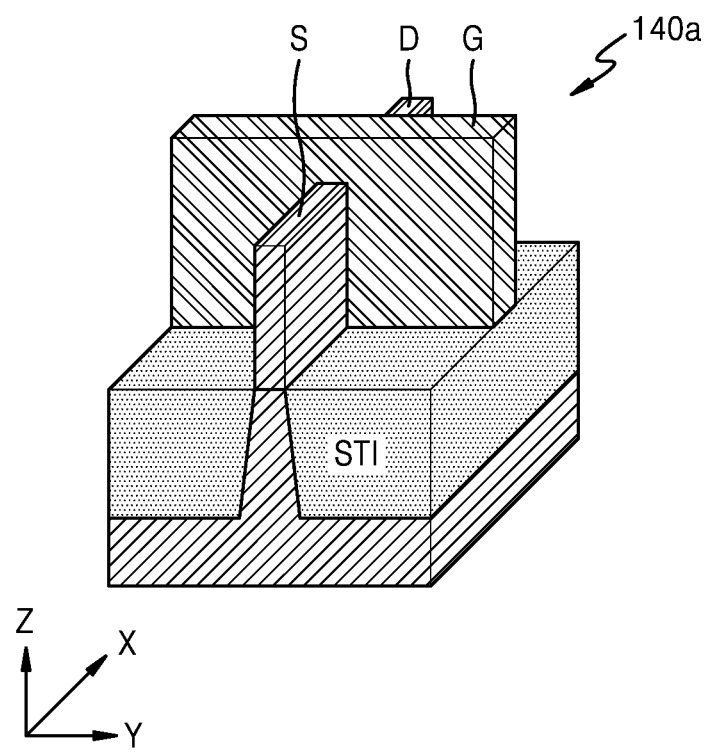
FIGS. 14A, 14B and 14C illustrate examples of devices according to example embodiments.
Figure 14B:
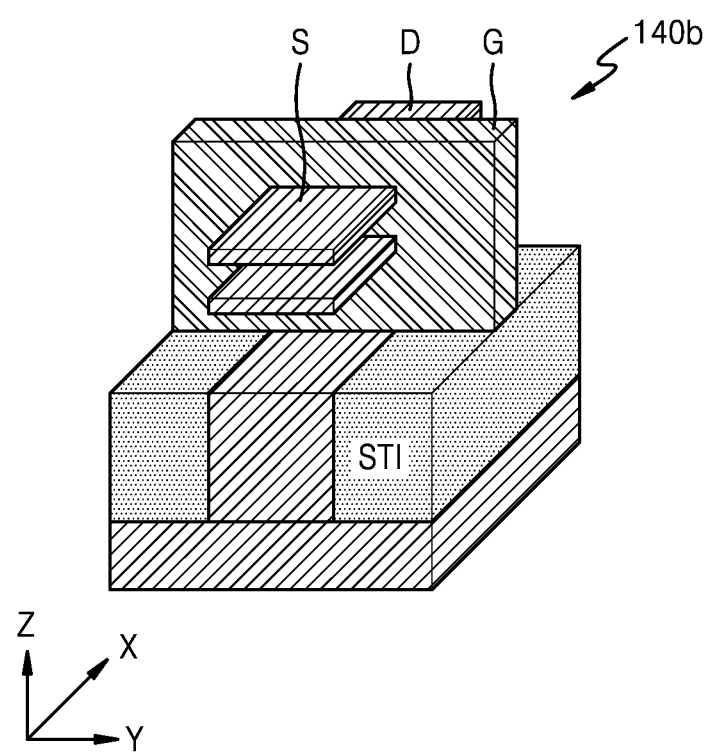
Figure 14C:
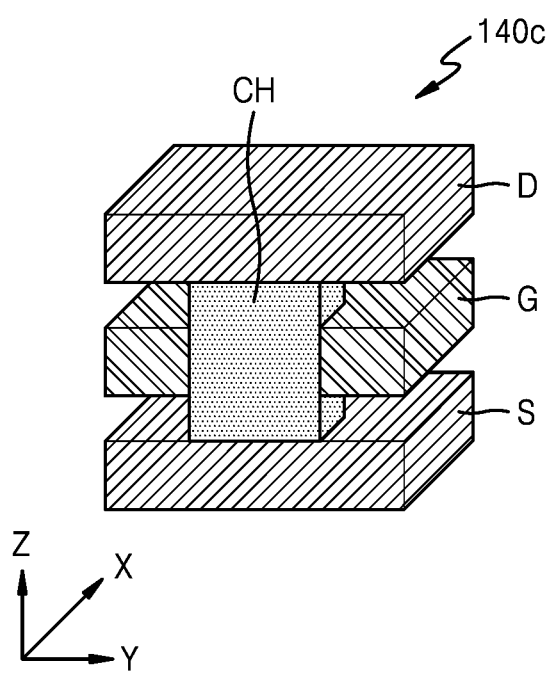

FIGS. 14A to 14C illustrate examples of devices according to example embodiments. Specifically, FIGS. 14A to 14C illustrate examples of devices that may be included in standard cells. Specifically, FIG. 14A illustrates a fin field effect transistor (FinFET) 140a, FIG. 14B illustrates a multi-bridge channel field effect transistor (MBCFET) 140b, and FIG. 14C illustrates a cross-section of a vertical field effect transistor (VFET) 140c cut in a plane that is parallel to a plane made up of Y and Z axes and passes through a channel of the VFET.

Referring to FIG. 14A, the FinFET 140a may include a fin-shaped active pattern extending in the X-axis direction between shallow trench isolations (STIs) and a gate G extending in the Y-axis direction. A source S and a drain D may be respectively formed on opposing sides of the gate G, and three surfaces or the gate G may face a channel (e.g., a portion of the fin-shaped active pattern) between the source S and the drain D. Referring to FIG. 14B, the MBCFET 140b may include a plurality of nanosheets, which extend in the X-axis direction and are separated from each other in the Z-axis direction, and a gate G extending in the Y-axis direction. A source S and a drain D may be respectively formed on opposing sides of the gate G, and the gate G may surround perimeters of channels (e.g., portions of the plurality of nanosheets) between the source S and the drain D. Referring to FIG. 14C, the VFET 140c may include a source S and a drain D separated from each other in the Z-axis direction with a channel CH therebetween. In addition, the VFET 140c may include a gate G that surrounds a perimeter of the channel CH between the source S and the drain D.

The devices of FIGS. 14A to 14C described above are merely examples, and a standard cell may include devices having other structures. For example, the active pattern may include a plurality of nanowires, which are separated from each other in the Z-axis direction and extend in the X-axis direction, and a standard cell may include a gate all around field effect transistor (GAAFET) formed with a plurality of nanowires and a gate electrode. In addition, the standard cell may also include a ForkFET in which an N-type transistor and a P-type transistor have a closer structure by separating nanosheets for the P-type transistor and nanosheets for the N-type transistor by using dielectric walls. In addition, the standard cell may also include a field effect transistor (FET), such as a complementary FET (CFET), a negative FET (NCFET), and a carbon nanotube (CNT) FET, or may also include a bipolar junction transistor and another three-dimensional transistor.

Figure 15A:
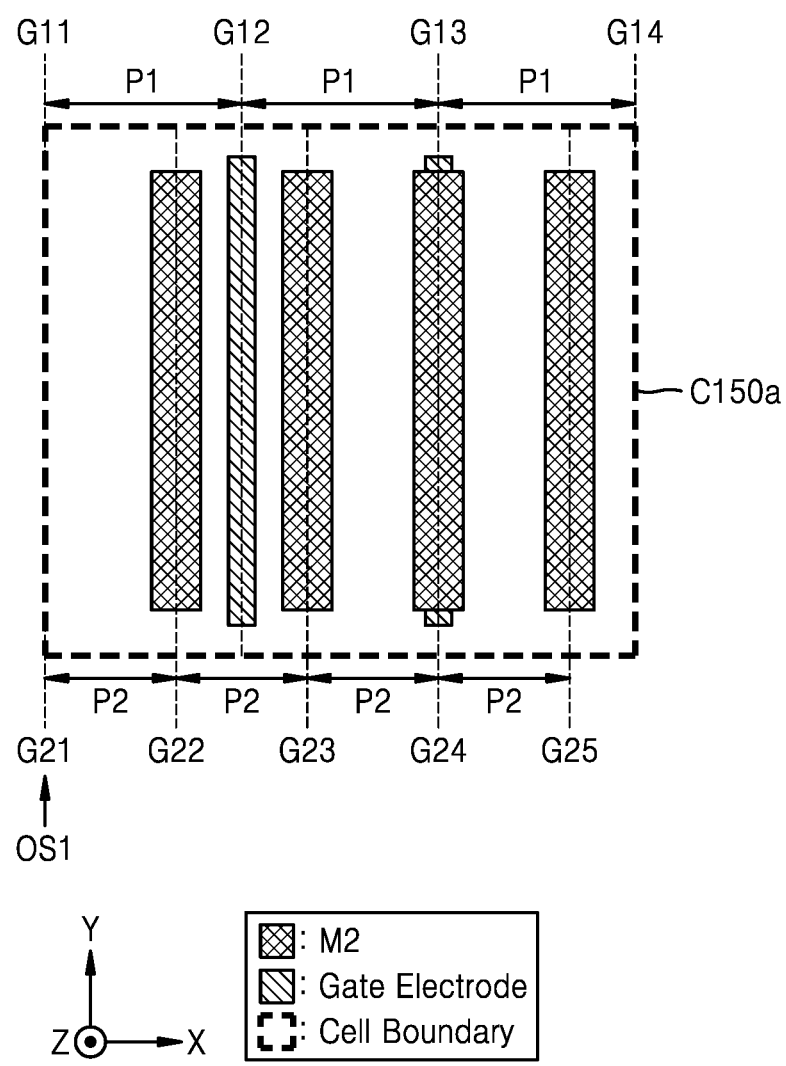
FIGS. 15A and 15B are plan views illustrating layouts of standard cells according to example embodiments.
Figure 15B:
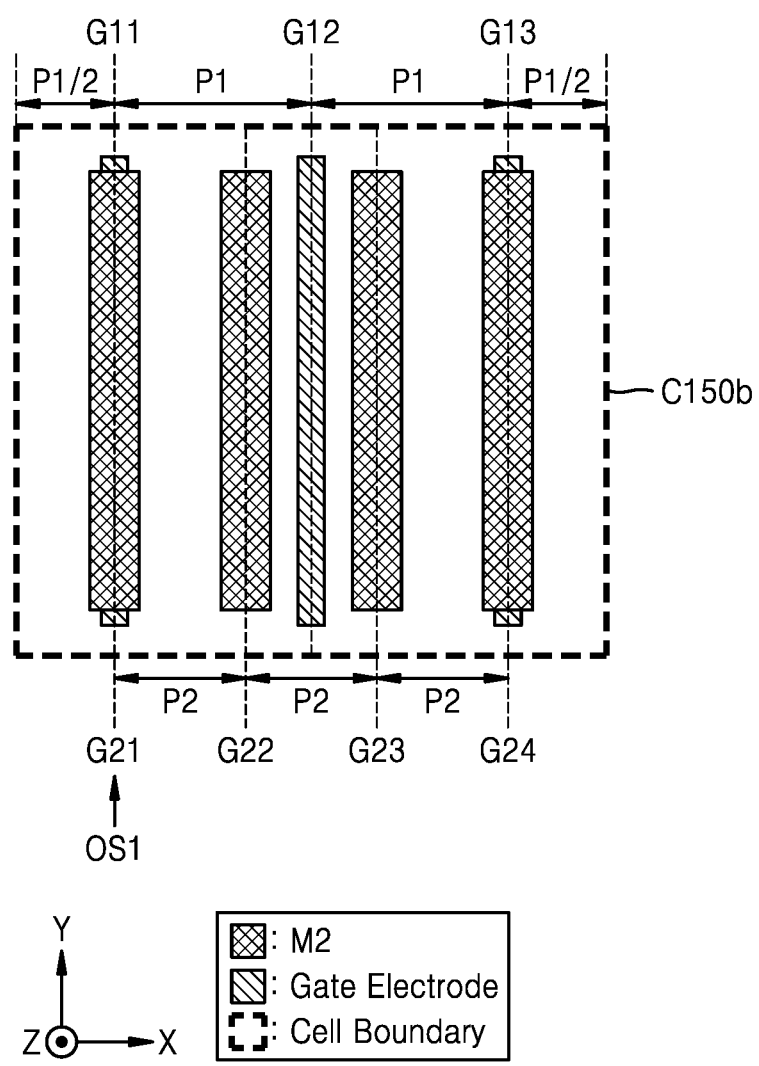

FIGS. 15A and 15B are plan views illustrating layouts of standard cells C150a and C150b according to example embodiments. Specifically, the plan views of FIGS. 15A and 15B illustrate patterns (that is, a gate electrode) of a gate electrode layer and patterns (that is, M2 patterns) of an M2 layer in the standard cells C150a and C150b. In the examples of FIGS. 15A and 15B, a first layer may be a gate electrode layer, and a second layer may be an M2 layer. In some embodiments, a standard cell may be terminated by a diffusion break. For example, a diffusion break extending in the Y-axis direction at a boundary between standard cells adjacent to each other in one row may be formed, and the standard cells may be separated by (e.g., electrically isolated by) the diffusion break.

In some embodiments, a standard cell may be terminated by a single diffusion break (SDB), which may be formed by filling a region corresponding to the gate electrode with an insulating material. For example, as illustrated in FIG. 15A, the standard cell C150a may be terminated by SDBs formed on first grid lines G11 and G14. Accordingly, the standard cell C150a may include gate electrodes extending in the Y-axis direction on the first grid lines G12 and G13, while gate electrodes extending in the Y-axis direction on the first grid lines G11 and G14 may be omitted. As illustrated in FIG. 15A, the standard cell C150a may include M2 patterns extending in the Y-axis direction on second grid lines G22 to G25 and have a first grid offset OS1 that is zero.

In some embodiments, a standard cell may be terminated by a double diffusion break (DDB), which may be formed by filling a region between two adjacent gate electrodes with an insulating material. For example, as illustrated in FIG. 15B, the standard cell 150b may have a boundary at a point separated from a first grid line G11 by half (P½) of a first pitch P1 and have a boundary at a point separated from a first grid line G13 by half (P½) of the first pitch P1. As illustrated in FIG. 15B, the standard cell C150b may include gate electrodes extending in the Y-axis direction on the first grid lines G11 to G13, but gate electrodes extending in the Y-axis direction on the first grid lines G11 and G13 may not be used due to the DDB. In addition, the standard cell C150b may include M2 patterns extending in the Y-axis direction on second grid lines G21 to G24 and have a first grid offset OS1 that is zero. The standard cell C150b may have the same width (that is, 3*P1) and the same grid offset (that is, OS1) as the standard cell C150a of FIG. 15A.

Although not illustrated in FIGS. 15A and 15B, an integrated circuit may include a standard cell that corresponds to the same circuit as the standard cell C150a of FIG. 15A and is terminated by an SDB and has a second grid offset OS2 in some embodiments. In addition, in some embodiments, an integrated circuit may include a standard cell that corresponds to the same circuit as the standard cell C150b of FIG. 15B and is terminated by a DDB and has a second grid offset OS2.

In some embodiments, an integrated circuit may include standard cells that are terminated by an SDB and each have different grid offsets. In some embodiments, an integrated circuit may include standard cells that are terminated by a DDB and each have different grid offsets. In some embodiments, an integrated circuit may include standard cells, which are terminated by SDB and DDB, that is, a mixed diffusion break (MDB), and each have different grid offsets. In some embodiments, as described above with reference to FIG. 14C, a diffusion break may be omitted between mutually adjacent vertical transistors, and thus, an integrated circuit may include standard cells that are terminated by a zero diffusion break (ZDB) and each have different grid offsets.

Figure 16:
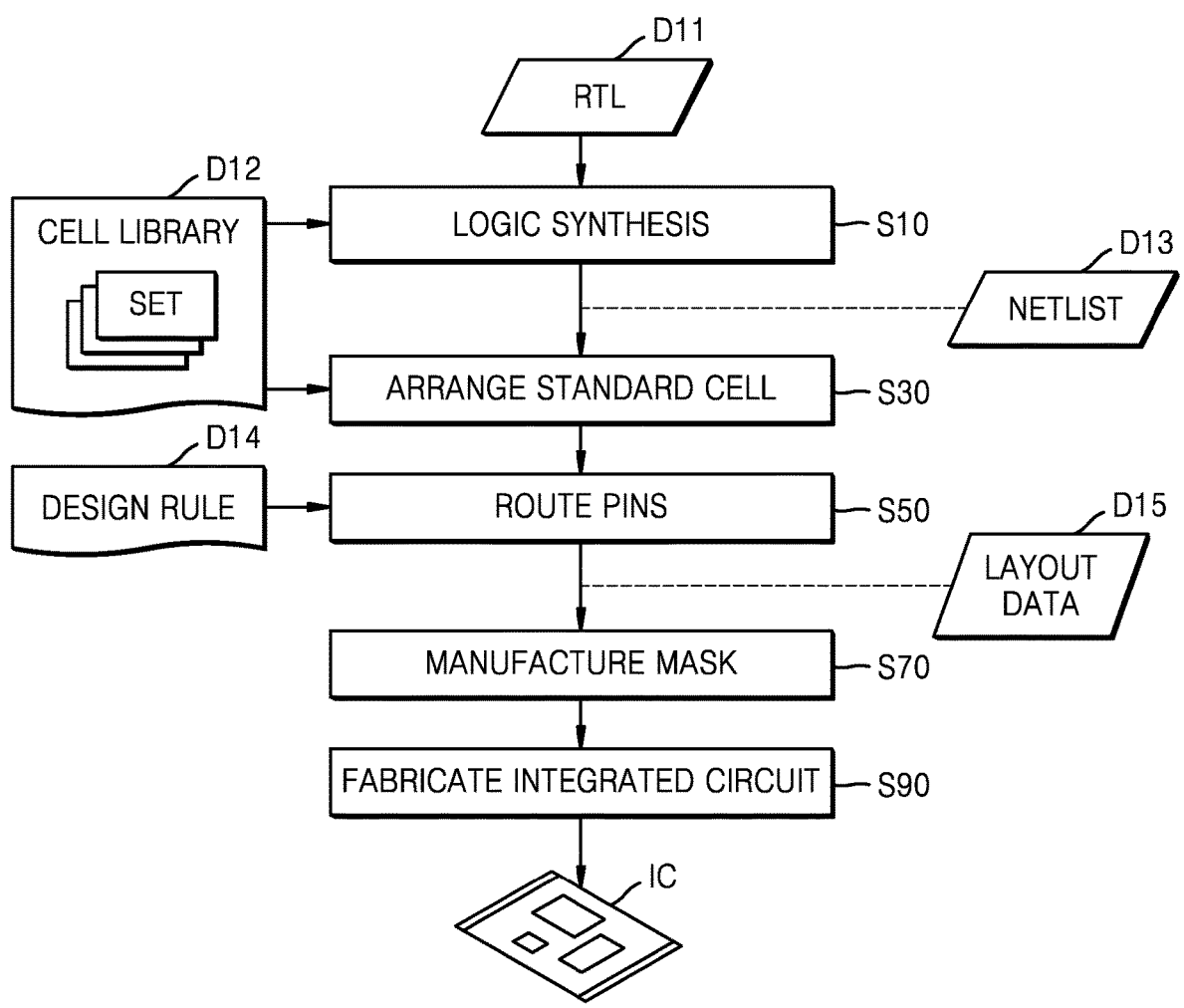
FIG. 16 is a flowchart illustrating a method of manufacturing an integrated circuit, according to an example embodiment.

FIG. 16 is a flowchart illustrating a method of manufacturing an integrated circuit (IC), according to an example embodiment. Specifically, the flowchart of FIG. 16 represents an example of a method of manufacturing an IC including standard cells. As illustrated in FIG. 16, a method of manufacturing an IC may include a plurality of operations S10, S30, S50, S70, and S90.

A cell library (or a standard cell library) D12 may include information on standard cells, for example, information on functions, characteristics, layouts, and so on. The cell library D12 may include a plurality of sets SET. In some embodiments, a plurality of sets SET may each define standard cells having (that is, corresponding to the same circuit) the same function and respectively having different grid offsets. In some embodiments, the plurality of sets SET may each define standard cells having (that is, corresponding to the same circuit) the same function and respectively corresponding to different colorings of multi-patterning. Examples of the plurality of sets SET will be described below with reference to FIGS. 17A to 17C.

A design rule D14 may include requirements that a layout of an IC has to comply with. For example, the design rule D14 may include requirements for a space between patterns in the same layer, a smallest width of a pattern, a routing direction of a wiring layer, and so on. In some embodiments, the design rule D14 may define a smallest separation distance within the same track of a wiring layer.

In operation S10, a logic synthesis operation for generating a netlist D13 from RTL data D11 may be performed. For example, a semiconductor design tool (for example, a logic synthesis tool) may generate a netlist D13 including a bitstream or a netlist by performing logic synthesis with reference to the cell library D12 from RTL data D11 generated as a hardware description language (HDL) such as a VHSIC hardware description language (VHDL) and Verilog. The netlist D13 may correspond to an input of placement and routing, which will be described below.

In operation S30, cells may be placed. For example, a semiconductor design tool (for example, a P&R tool) may place standard cells used in the netlist D13 with reference to the cell library D12. In some embodiments, the semiconductor design tool may select a standard cell included in one of the plurality of sets SET and place the selected standard cell. Examples of operation S30 will be described below with reference to FIGS. 17A to 17C.

In operation S50, pins of cells may be routed. For example, the semiconductor design tool may generate interconnections electrically connecting output pins and input pins of the placed standard cells to each other and generate layout data D15 defining the placed standard cells and the generated interconnections. The interconnections may include a via in a via layer and/or a pattern in a wiring layer. The layout data D15 may have a format, such as GDSII, and may include geometric information of cells and interconnections. The semiconductor design tool may rout the pins of the cells with reference to the design rule D14. The layout data D15 may correspond to an output of placement and routing. Only operation S50 or both operation S30 and operation S50 may be referred to as a method of designing an integrated circuit.

In operation S70, an operation of fabricating a mask may be performed. For example, in photolithography, optical proximity correction (OPC) for correcting distortion such as refraction caused by characteristics of light may be applied to the layout data D15. Patterns on a mask may be defined to form patterns arranged on a plurality of layers based on the data to which the OPC is applied, and at least one mask (or photomask) for forming patterns of each of the plurality of layers may be made. In some embodiments, a layout of an IC may be limitedly modified in operation S70, and the limited modification of the IC in operation S70 is post-processing for optimizing a structure of the IC and may be referred to as design polishing.

In operation S90, an operation of manufacturing an IC may be performed. For example, an IC may be manufactured by patterning a plurality of layers by using at least one mask made in operation S70. Front-end-of-line (FEOL) may include, for example, an operation of planarizing and cleaning a wafer, an operation of forming trenches, an operation of forming wells, an operation of forming gate electrodes, and an operation of forming a source and a drain, and individual devices, such as transistors, capacitors, and resistors, may be formed on a substrate by FEOL. In addition, back-end-of-line (BEOL) may include, for example, an operation of performing silicidation of a gate region, a source region, and a drain region, an operation of adding a dielectric, an operation of performing planarization, an operation of forming holes, an operation of adding metal layers, an operation of forming vias, an operation of forming a passivation layer, and so on, and individual devices, such as transistors, capacitors, and resistors, may be interconnected by BEOL. In some embodiments, middle-of line (MOL) may be performed between the FEOL and the BEOL, and thereby, contacts may be formed on individual devices. Subsequently, an IC may be packaged in a semiconductor package to be used as a component in various applications.

Figure 17A:
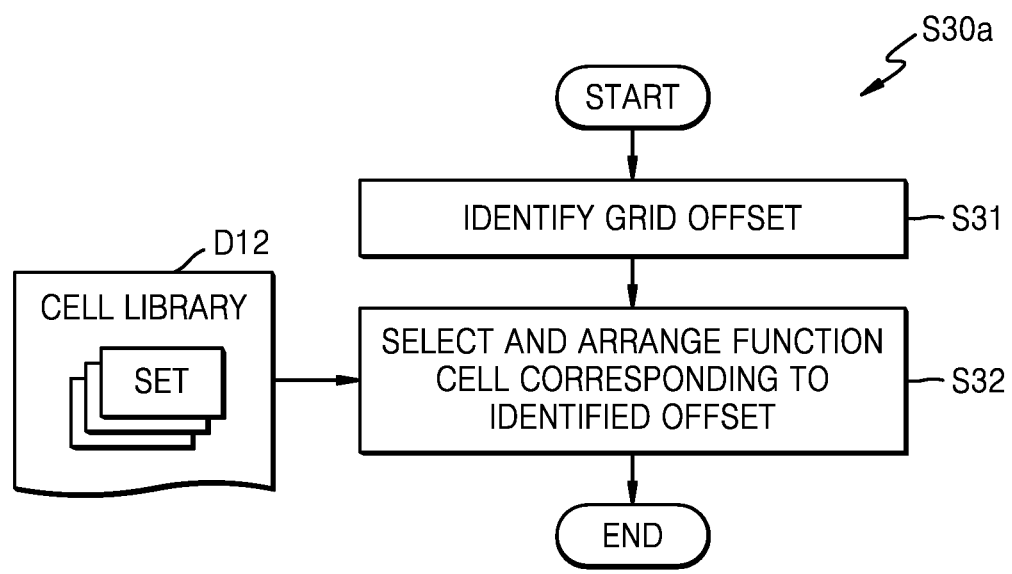
FIGS. 17A, 17B and 17C are flowcharts illustrating examples of a method of designing an integrated circuit including standard cells, according to example embodiments.
Figure 17B:
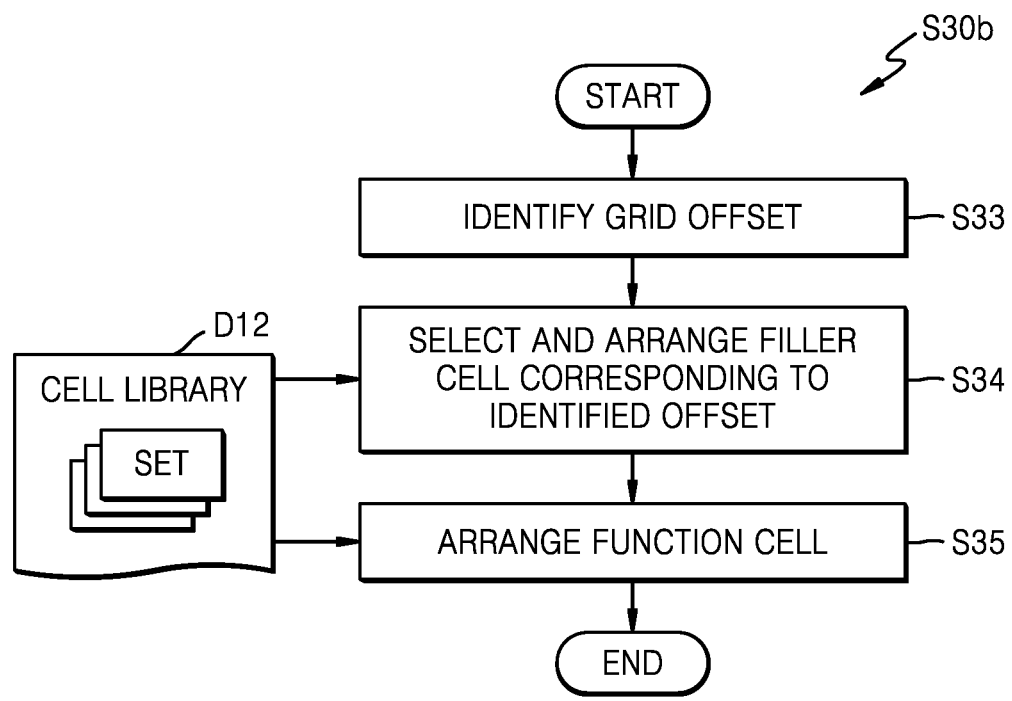
Figure 17C:
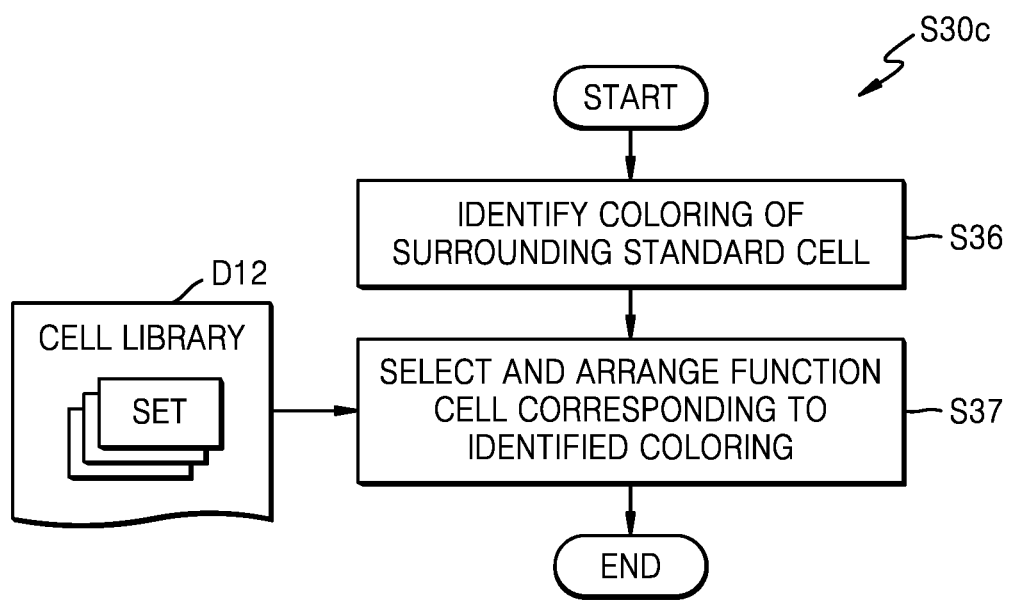

FIGS. 17A to 17C are flowcharts illustrating examples of a method of designing an integrated circuit including standard cells, according to example embodiments. Specifically, the flowcharts of FIGS. 17A to 17C illustrate examples of operation S30 of FIG. 16. As described above with reference to FIG. 16, standard cells may be arranged in each of operation S30a of FIG. 17A, operation S30b of FIG. 17B, and operation S30c of FIG. 17C. Hereinafter, FIGS. 17A to 17C will be described with reference to FIG. 16.

Referring to FIG. 17A, operation S30a may include operation S31 and operation S32. In operation S31, a grid offset may be identified. For example, a semiconductor design tool may identify a grid offset of a location in which a standard cell defined in the netlist D13 may be placed. As described above with reference to the drawings, various grid offsets may be provided due to a difference between a first pitch of a first grid and a second pitch of a second grid, and a semiconductor design tool may identify one of the possible grid offsets.

In operation S32, a function cell corresponding to the identified offset may be selected and placed. For example, the semiconductor design tool may select one set from among the plurality of sets SET included in the cell library D12 based on the grid offset identified in operation S31. The semiconductor design tool may identify a layout corresponding to a standard cell to be placed in the selected set and place the identified layout. Accordingly, standard cells may be efficiently arranged, an area of an integrated circuit may be reduced, and performance may be improved.

In some embodiments, a first set of the plurality of sets SET may define a layout of a standard cell corresponding to a first circuit and having a first grid offset, while a second set of the plurality of sets SET may define a layout of a standard cell corresponding to the first circuit and having a second grid offset. In some embodiments, as described above with reference to FIGS. 1A and 1B, in the standard cell of the first set and the standard cell of the second set, pattern of a second layer may be omitted on a first grid line and a second grid line overlapping each other.

In some embodiments, as described above with reference to FIG. 4A, a first set of the plurality of sets SET may define a layout of a first standard cell corresponding to a first circuit and having a first grid offset, and a second set of the plurality of sets SET may define a layout of a second standard cell corresponding to the first circuit and having the first grid offset and including a layout of the first standard cell and an additional region. In addition, in some embodiments, as described above with reference to FIG. 4B, a third set of the plurality of sets SET may define a layout of a third standard cell corresponding to a first circuit and having a second grid offset, and the third standard cell may include a multi-height cell different from the first standard cell.

In some embodiments, as described above with reference to FIGS. 5A to 5D, a first set of the plurality of sets SET may define a layout of a first standard cell corresponding to a first circuit and having a first grid offset, while a second set of the plurality of sets SET may define a layout of a second standard cell corresponding to the first circuit and having the first grid offset and including patterns of a second layer multi-patterned differently from the first standard cell. In addition, a third set of the plurality of sets SET may define a layout of a third standard cell corresponding to a first circuit and having a second grid offset, while a fourth set of the plurality of sets SET may define a layout of a fourth standard cell corresponding to the first circuit and having a second grid offset and including patterns of a second layer multi-patterned differently from the third standard cell.

In some embodiments, as described above with reference to FIGS. 15A and 15B, a first set of the plurality of sets SET may define a layout of a first standard cell corresponding to a first circuit and having a first grid offset and terminated by an SDB, while a second set of the plurality of sets SET may define a layout of a second standard cell corresponding to the first circuit and having the first grid offset and terminated by a DDB.

Referring to FIG. 17B, operation S30b may include operation S33 to operation S35. In operation S33, a grid offset may be identified. For example, a semiconductor design tool may identify a grid offset of a location in which a standard cell defined in the netlist D13 may be arranged. As described above with reference to the drawings, various grid offsets may be provided due to a difference between a first pitch of a first grid and a second pitch of a second grid, and the semiconductor design tool may identify one of possible grid offsets.

In operation S34, a filler cell corresponding to the identified offset may be selected to be placed, and in operation S35, a function cell may be placed. For example, when the grid offset identified in operation S33 is different from a grid offset of a function cell to be placed, the semiconductor design tool may select one set from among the plurality of sets SET included in the cell library D12. In some embodiments, as described above with reference to FIGS. 3A and 3B, a first set of the plurality of sets SET may define a first filler cell having a first grid offset, while a second set of the plurality of sets SET may define a second filler cell having a second grid offset. The semiconductor design tool may identify a layout corresponding to a filler cell to be placed in the selected set, place the identified layout, and place a function cell adjacent to the placed filler cell.

Referring to FIG. 17C, operation S30c may include operation S36 and operation S37. In operation S36, coloring of a surrounding standard cell may be identified. For example, the semiconductor design tool may identify coloring of patterns included in a standard cell around a location in which a standard cell defined in the netlist D13 is to be arranged. As described above with reference to the drawings, patterns included in standard cells may be colored by multi-patterning, and the semiconductor design tool may identify coloring of the standard cells previously placed in the periphery of a position to be placed.

In operation S37, a function cell corresponding to the identified coloring may be selected to be placed. For example, the semiconductor design tool may select one set from among the plurality of sets SET included in the cell library D12 based on the coloring identified in operation S36. The semiconductor design tool may identify a layout corresponding to a standard cell to be placed in the selected set and arrange the identified layout. Accordingly, collision of the multi-patterning may not occur while maintaining the designed performance of an integrated circuit.

In some embodiments, as described above with reference to FIGS. 7A to 8B, the plurality of sets SET may each define standard cells having the same function and respectively corresponding to different colorings of a third layer. In addition, in some embodiments, as described above with reference to FIGS. 9A to 11B, the plurality of sets SET may each define standard cells having the same function and respectively corresponding to different colorings of a second layer.

Figure 18:
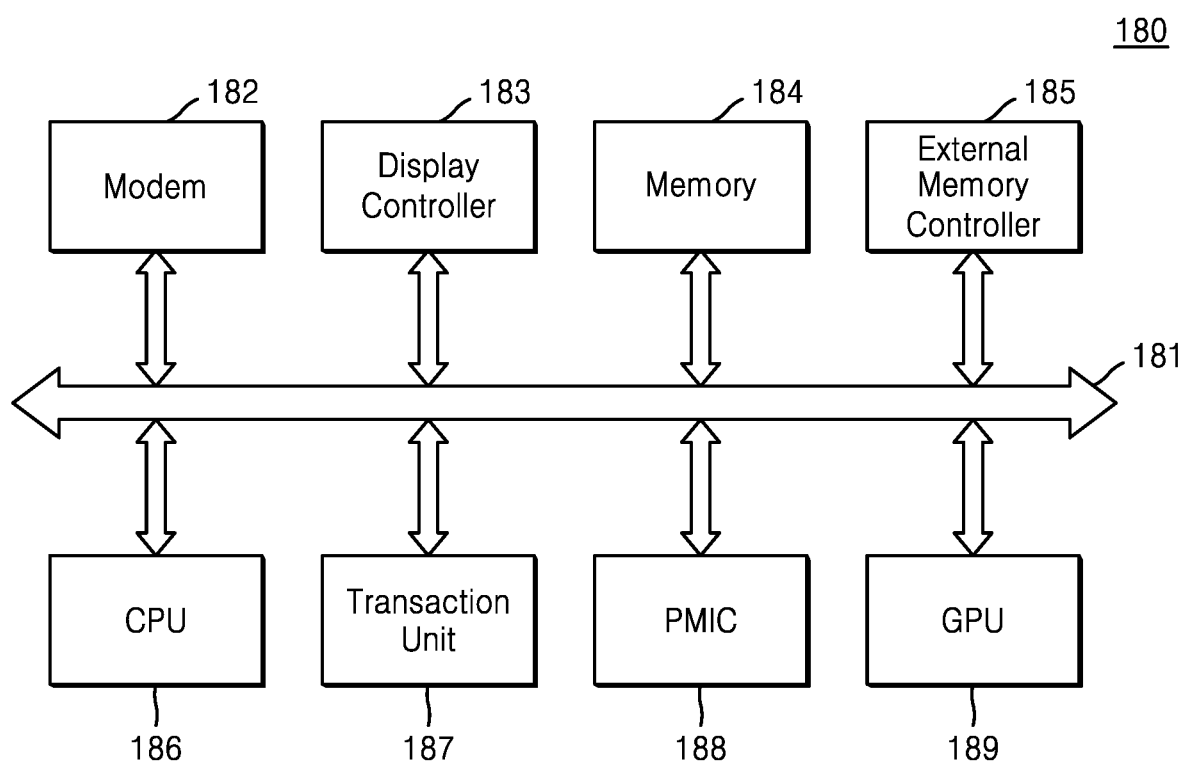
FIG. 18 is a block diagram illustrating a system on chip (SoC) according to an example embodiment.

FIG. 18 is a block diagram illustrating a system on chip (SoC) 180 according to an example embodiment. The system on chip 180 is a semiconductor device and may include an integrated circuit according to an example embodiment. The system on chip 180 implements complex blocks, such as intellectual property (IP) for performing various functions, in one chip, and may be designed by a method for designing an integrated circuit, according to example embodiments, and thus, the system on chip 180 may have a reduced area and improved performance. Referring to FIG. 18, the system on chip 180 may include a modem 182, a display controller 183, a memory 184, an external memory controller 185, a central processing unit (CPU) 186, a transaction unit 187, a power management integrated circuit (PMIC) 188, and a graphics processing unit (GPU) 189, and respective functional blocks of the system on chip 180 may communicate with each other via a system bus 181.

The CPU 186 that may control an operation of the system on chip 180 in an uppermost layer may control operations of other functional blocks 182 to 189. The modem 182 may demodulate a signal received from the outside of the system on chip 180 or modulate a signal generated by the system on chip 180 and transmit the demodulated or modulated signal to the outside. The external memory controller 185 may control an operation of transmitting and receiving data to and from an external memory device connected to the system on chip 180. For example, programs and/or data stored in the external memory device may be provided to the CPU 186 or the GPU 189 by control of the external memory controller 185. The GPU 189 may perform program instructions related to graphics processing. The GPU 189 may also receive graphic data through the external memory controller 185 and also transmit the graphic data processed by the GPU 189 to the outside of the system on chip 180 through the external memory controller 185. The transaction unit 187 may monitor data transactions of the respective functional blocks, and the PMIC 188 may control power supplied to the respective functional blocks according to the control of the transaction unit 187. The display controller 183 may transmit the data generated by the system on chip 180 to a display by controlling the display (or a display device) outside the system on chip 180. The memory 184 may also include a non-volatile memory, such as electrically erasable programmable read-only memory (EEPROM) or flash memory, and may also include a volatile memory, such as dynamic random access memory (DRAM) or static random access memory (SRAM).

Figure 19:
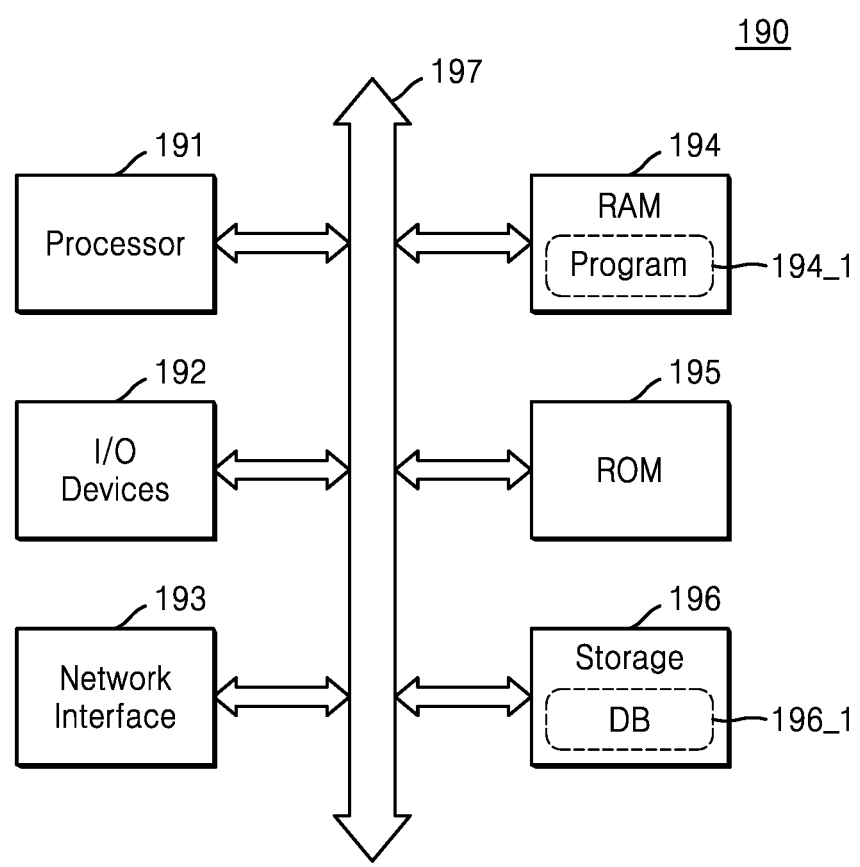
FIG. 19 is a block diagram illustrating a computing system including a memory for storing a program, according to an example embodiment.

FIG. 19 is a block diagram illustrating a computing system 190 including a memory for storing a program, according to an example embodiment. In the method of designing an integrated circuit according to an example embodiment, for example, at least some of the operations in the flowchart described above may be performed by the computing system (or a computer) 190.

The computing system 190 may include a stationary computing system, such as a desktop computer, a workstation, and a server, or may include a portable computing system, such as a laptop computer. As illustrated in FIG. 19, the computing system 190 may include a processor 191, input/output (I/O) devices 192, a network interface 193, a random access memory (RAM) 194, a read only memory (ROM) 195, and a storage 196. The processor 191, the I/O devices 192, the network interface 193, the RAM 194, the ROM 195, and the storage 196 may be connected to a bus 197 and may communicate with each other via the bus 197.

The processor 191 may be referred to as a processing unit and may include at least one core, which may perform any instruction set (for example, Intel Architecture-32 (IA-32), 64-bit-extended IA-32, x86-64, PowerPC, Sparc, MIPS, ARM, IA-64, and so on), such as a micro-processor, an application processor (AP), a digital signal processor (DSP), or a graphics processing unit (GPU). For example, the processor 191 may access a memory, that is, the RAM 194 or the ROM 195, via the bus 197, and perform instructions stored in the RAM 194 and the ROM 195.

The RAM 194 may store a program 194_1 or at least a part thereof for a method of designing an integrated circuit, according to an example embodiment, and the program 194_1 may cause the processor 191 to perform the method of designing the integrated circuit, for example, at least some of the operations included in the methods of FIG. 16 and FIGS. 17A to 17C. That is, the program 194_1 may include a plurality of instructions executable by the processor 191, and the plurality of instructions included in the program 194_1 may cause the processor 191 to perform at least some of the operations included in, for example, the flowcharts described above.

The storage 196 may not lose stored data even when the power supplied to the computing system 190 is off. For example, the storage 196 may also include a non-volatile memory device and may also include a storage medium, such as a magnetic tape, an optical disk, or a magnetic disk. In addition, the storage 196 is removable from the computing system 190. The storage 196 may store the program 194_1 according to an example embodiment, and before the program 194_1 is executed by the processor 191, the program 194_1 or at least a part thereof may be loaded into the RAM 194 from the storage 196. Alternatively, the storage 196 may store a file written in a programming language, and the program 194_1 generated from the file by a compiler or the like or at least a part thereof may be loaded into the RAM 194. In addition, as illustrated in FIG. 19, the storage 196 may store a database 196_1, and the database 196_1 may include information required for designing an integrated circuit, for example, information on designed blocks, the cell library D12 of FIG. 16, and/or the design rule D14.

The storage 196 may also store data to be processed by the processor 191 or data processed by the processor 191. That is, the processor 191 may generate data by processing the data stored in the storage 196 according to the program 194_1 and also store the generated data in the storage 196. For example, the storage 196 may store the RTL data D11, the netlist D13, and/or the layout data D15 of FIG. 16.

The I/O devices 192 may include an input device, such as a keyboard or a pointing device, and include an output device, such as a display device or a printer. For example, a user may also trigger execution of the program 194_1 by using the processor 191 through the I/O devices 192, also read the RTL data D11 and/or the netlist D13 of FIG. 16, and also check the layout data D15 of FIG. 16.

The network interface 193 may provide an access to an external network of the computing system 190. For example, the external network may include multiple computing systems and communication links, and the communication links may include wired links, optical links, wireless links, or any other type of links.

The terms "first," "second," "third," etc., may be used herein merely to distinguish one element from another. As used herein the term "and/or" includes any and all combinations of one or more of the associated listed items.

While the inventive concept has been particularly shown and described with reference to embodiments thereof, it will be understood that various changes in form and details may be made therein without departing from the spirit and scope of the following claims.

What is claimed is:

1. An integrated circuit comprising:
  a first function cell including at least one first pattern extending in a first direction along a first grid in a first layer and at least one second pattern extending in the first direction along a second grid in a second layer; and
  a second function cell including at least one third pattern extending in the first direction along the first grid in the first layer and at least one fourth pattern extending in the first direction along the second grid in the second layer,
  wherein the first function cell and the second function cell respectively correspond to a first circuit, the first grid has a first pitch in a second direction greater than a second pitch of the second grid in the second direction, and the second direction crossing the first direction, the second grid has a first offset from the first grid in the first function cell and has a second offset from the first grid in the second function cell, and the second offset is different from the first offset, in the first function cell and the second function cell, the second grid comprises a grid line that has a third offset from the first grid and extends in the first direction, and the at least one second pattern does not overlap the grid line of the second grid in the first function cell, and the at least one fourth pattern does not overlap the grid line of the second grid in the second function cell.

2. The integrated circuit of claim 1, further comprising fifth patterns overlapping the first grid and the second grid and extending parallel to each other in the first direction in the second layer, wherein the fifth patterns include a pattern crossing the first function cell and a pattern crossing the second function cell.

3. The integrated circuit of claim 1, further comprising:
a first filler cell having a length of the first pitch in the second direction; and
a second filler cell having the length of the first pitch in the second direction,
wherein the second grid has the first offset from the first grid in the first filler cell and has the second offset from the first grid in the second filler cell.

4. The integrated circuit of claim 1, further comprising a third function cell corresponding to the first circuit, including a layout of the first function cell, and having a length greater than a length of the first function cell by the first pitch in the second direction.

5. The integrated circuit of claim 1, further comprising a fourth function cell corresponding to the first circuit, having a length in the first direction longer than respective lengths of the first function cell and the second function cell in the first direction, and having a length in the second direction shorter than respective lengths of the first function cell and the second function cell in the second direction, wherein the second grid has the second offset from the first grid in the fourth function cell.

6. The integrated circuit of claim 1, further comprising:
a fifth function cell including a fifth pattern extending in the first direction along the first grid in the first layer, and a sixth pattern extending in the first direction along the second grid in the second layer; and
a sixth function cell including a seventh pattern extending in the first direction along the first grid in the first layer, and an eighth pattern extending in the first direction along the second grid in the second layer, wherein the fifth function cell and the sixth function cell each correspond to the first circuit, the second grid has the first offset from the first grid in the fifth function cell and has the second offset from the first grid in the sixth function cell, the at least one second pattern and the at least one fourth pattern are first exposure patterns of multi-patterning, and the sixth pattern and the eighth pattern are second exposure patterns of multi-patterning.

7. The integrated circuit of claim 1, wherein
the first layer is a gate electrode layer, and
the second layer is a routing layer over the gate electrode layer.

8. The integrated circuit of claim 1, wherein
the first layer is a contact layer, and
the second layer is a routing layer over the contact layer.

9. The integrated circuit of claim 1, wherein each of the first function cell and the second function cell includes at least one of a fin field effect transistor (FinFET), a gate all around (GAA) transistor, a vertical field effect transistor (VFET), and a stacked transistor.

10. The integrated circuit of claim 1, wherein each of the at least one second pattern and the at least one fourth pattern has a length in the first direction greater than the first pitch.

11. The integrated circuit of claim 1, wherein each of the first function cell and the second function cell is terminated by one of a single diffusion break (SDB) and a double diffusion break (DDB) at each of boundaries extending in the first direction.

12. The integrated circuit of claim 1, wherein a ratio between the first pitch and the second pitch is m:n, and m and n are positive integers.

13. An integrated circuit comprising:
a first function cell and a second function cell each corresponding to a first circuit,
wherein the first function cell includes a first pattern extending in a first direction along a first grid in a first layer and a second pattern extending in the first direction along a second grid in a second layer,
the first grid has a first pitch greater than a second pitch of the second grid in a second direction crossing the first direction, and
the second function cell includes a layout of the first function cell and has a length in the second direction longer than a length of the first function cell in the second direction by the first pitch.

14. The integrated circuit of claim 13, wherein the second grid has a first offset from the first grid in each of the first and second function cells.

15. The integrated circuit of claim 13, further comprising a third function cell corresponding to the first circuit, having a length in the first direction greater than a length of the first function cell in the first direction, and having a length in the second direction shorter than a length of the first function cell in the second direction.

16. The integrated circuit of claim 15, wherein the second grid has a first offset from the first grid in the first function cell and has a second offset from the first grid in the third function cell.

17. The integrated circuit of claim 13, wherein the second pattern has a length in the first direction greater than the first pitch.

18. An integrated circuit comprising:
a first function cell, a second function cell, a third function cell, and a fourth function cell each corresponding to a first circuit,
wherein each of the first function cell, the second function cell, the third function cell, and the fourth function cell includes a first pattern extending in a first direction along a first grid in a first layer and a second pattern extending in the first direction along a second grid in a second layer,
the first grid has a first pitch greater than a second pitch of the second grid in a second direction crossing the first direction,
the second grid has a first offset from the first grid in the first function cell and the third function cell and has a second offset from the first grid in the second function cell and the fourth function cell, the second pattern of the first function cell and the second pattern of the second function cell are first exposure patterns of multi-patterning, and the second pattern of the third function cell and the second pattern of the fourth function cell are second exposure patterns of multi-patterning.

19. The integrated circuit of claim 18, further comprising:

a first filler cell having a length of the first pitch in the second direction; and a second filler cell having the length of the first pitch in the second direction, wherein the second grid has the first offset from the first grid in the first filler cell and has the second offset from the first grid in the second filler cell.

20. The integrated circuit of claim 18, wherein the second pattern has a length in the first direction greater than the first pitch.

* * * * *